US006232904B1

(12) United States Patent
Hartmann et al.

(10) Patent No.: US 6,232,904 B1
(45) Date of Patent: May 15, 2001

(54) SCANNING SYSTEM FOR FILM RECORDER

(75) Inventors: Robert F. Hartmann, Westford; Patrick J. Hegarty, Roslindale; Timothy R. Crawford, Needham; Thomas H Campbell, East Falmouth, all of MA (US)

(73) Assignee: Polaroid Corporation, Cambridge, MA (US)

( * ) Notice: Subject to any disclaimer, the term of this patent is extended or adjusted under 35 U.S.C. 154(b) by 0 days.

(21) Appl. No.: 09/471,782

(22) Filed: Dec. 23, 1999

Related U.S. Application Data

(60) Provisional application No. 60/113,564, filed on Dec. 23, 1998.

(51) Int. Cl.[7] .................................................. H03H 1/68
(52) U.S. Cl. ........................... 341/145; 341/120; 315/367
(58) Field of Search .................................... 341/118, 120, 341/144, 145, 148; 315/367

(56) References Cited

U.S. PATENT DOCUMENTS

| Re. 33,973 | 6/1992 | Kriz et al. ............................ 358/244 |
| 4,272,760 | 6/1981 | Prazak et al. ........................ 340/347 |
| 4,573,005 | 2/1986 | Van de Plassche ................... 323/315 |
| 4,704,699 | 11/1987 | Farina et al. ......................... 364/525 |
| 4,769,715 | 9/1988 | Feldman et al. ..................... 358/244 |
| 4,885,581 | 12/1989 | Sugawara et al. ................... 341/145 |
| 4,998,108 | 3/1991 | Ginthner et al. ..................... 341/145 |
| 5,111,119 | 5/1992 | Truskalo et al. ..................... 315/389 |
| 5,153,592 | 10/1992 | Fairchild et al. ..................... 341/118 |
| 5,294,866 | * 3/1994 | Miyazaki et al. .................... 315/367 |
| 5,451,946 | 9/1995 | Smith et al. ......................... 341/118 |
| 5,666,118 | * 9/1997 | Gersbach ............................. 341/145 |
| 5,703,596 | 12/1997 | Tucholski ............................ 341/144 |

OTHER PUBLICATIONS

Application Note: AN—313, Analog Devices, "Getting the Most From High Resolution D/A Converters," by Scott Wayne, Reprint from Electronic Products Magazine, Dec. 12, 1983.

AD—760, Analog Devices, Functional Block Diagram—Rev. A, Description / Specification / Performance, "16/18 Bit Self –Calibrating Serial/Byte DACPORT," 1995.

* cited by examiner

Primary Examiner—Howard L. Williams

(57) ABSTRACT

A scanning system for a film recorder utilizes multiple digital-to-analog converters (DACs) to produce a linear output for a vertical deflection circuit which drives a vertical yoke circuit for controlling a CRT beam in a film recorder. The system contains a coarse DAC, a fine DAC, and a delta DAC which provides a signal representing the analog change from line to line. A summing circuit, a difference amplifier, a A/D converter, and a calibration sequence controlled by a DSP create a table to effectively increase the resolution and linearity of the deflection output signal.

8 Claims, 33 Drawing Sheets

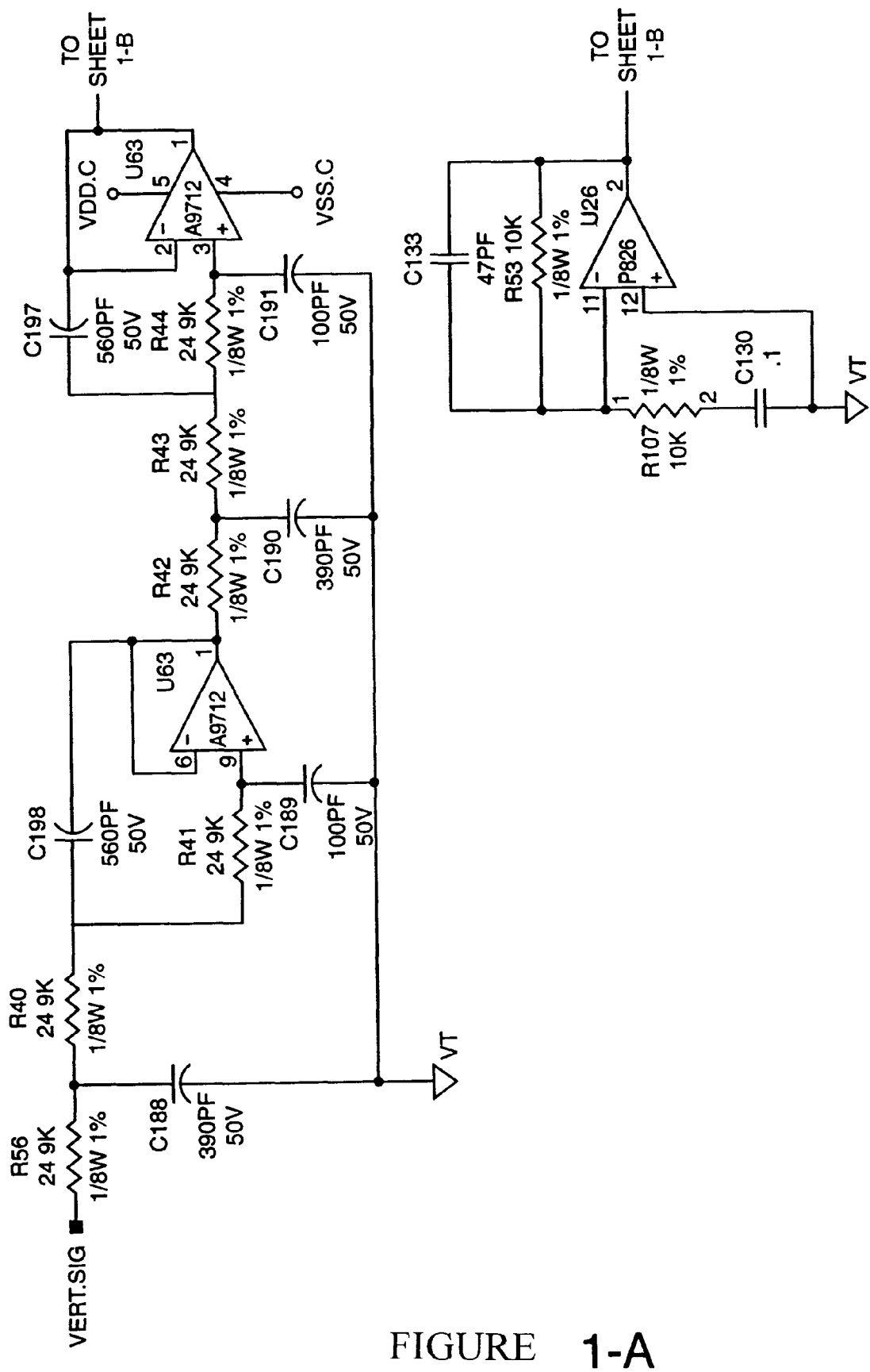
FIGURE 1-A

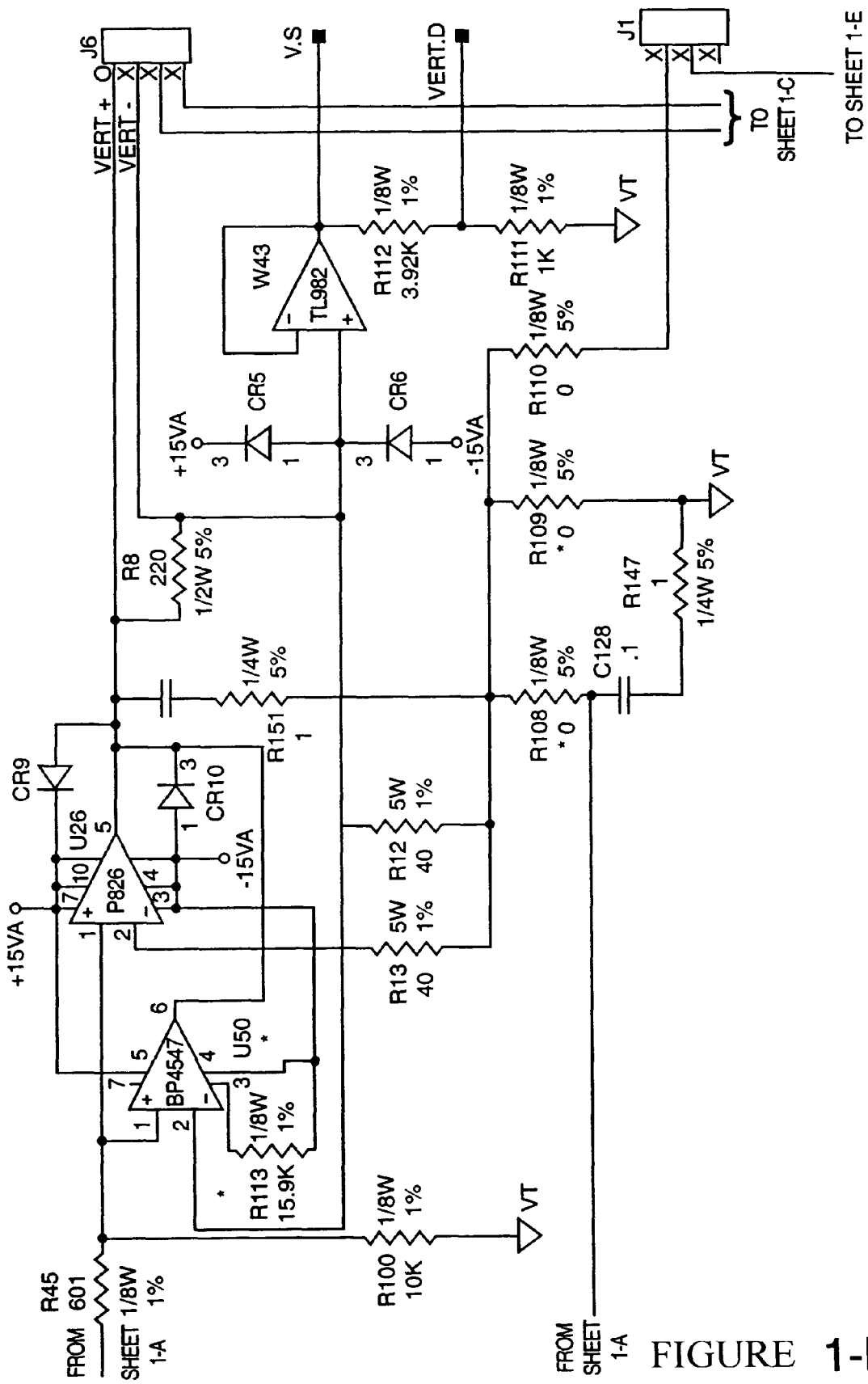
FIGURE 1-B

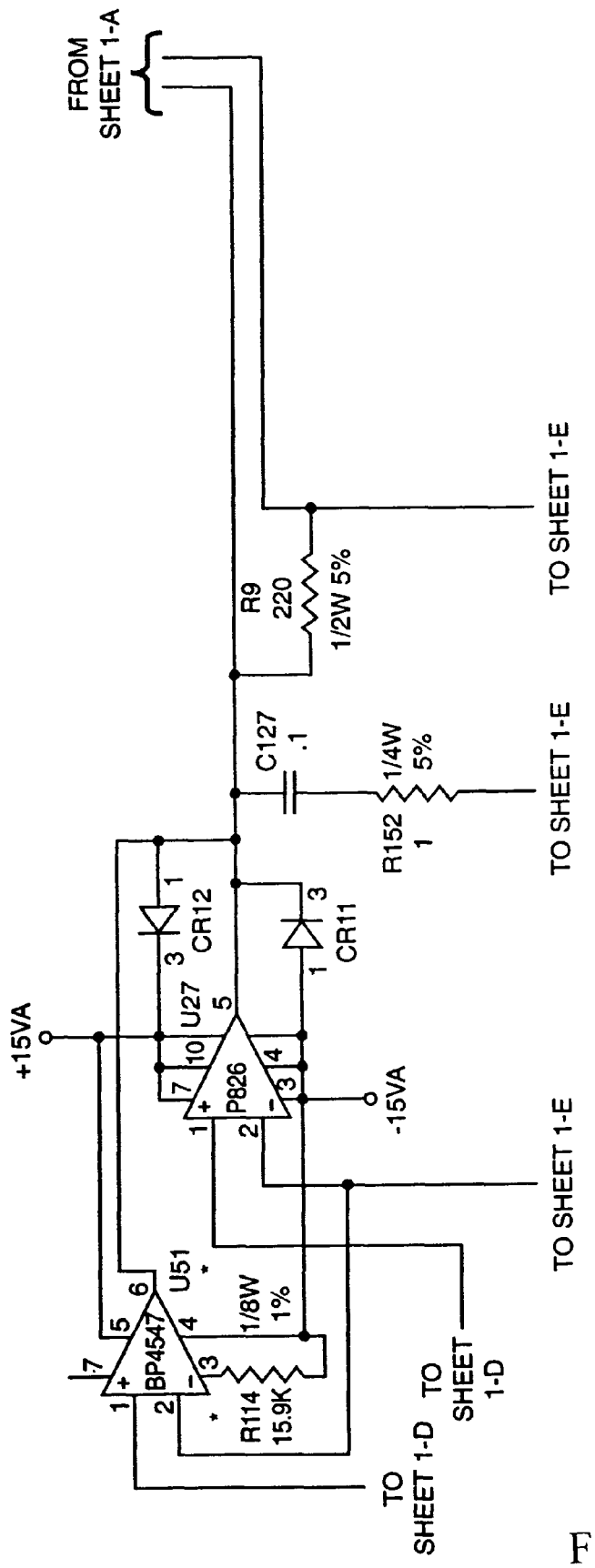
FIGURE 1-C

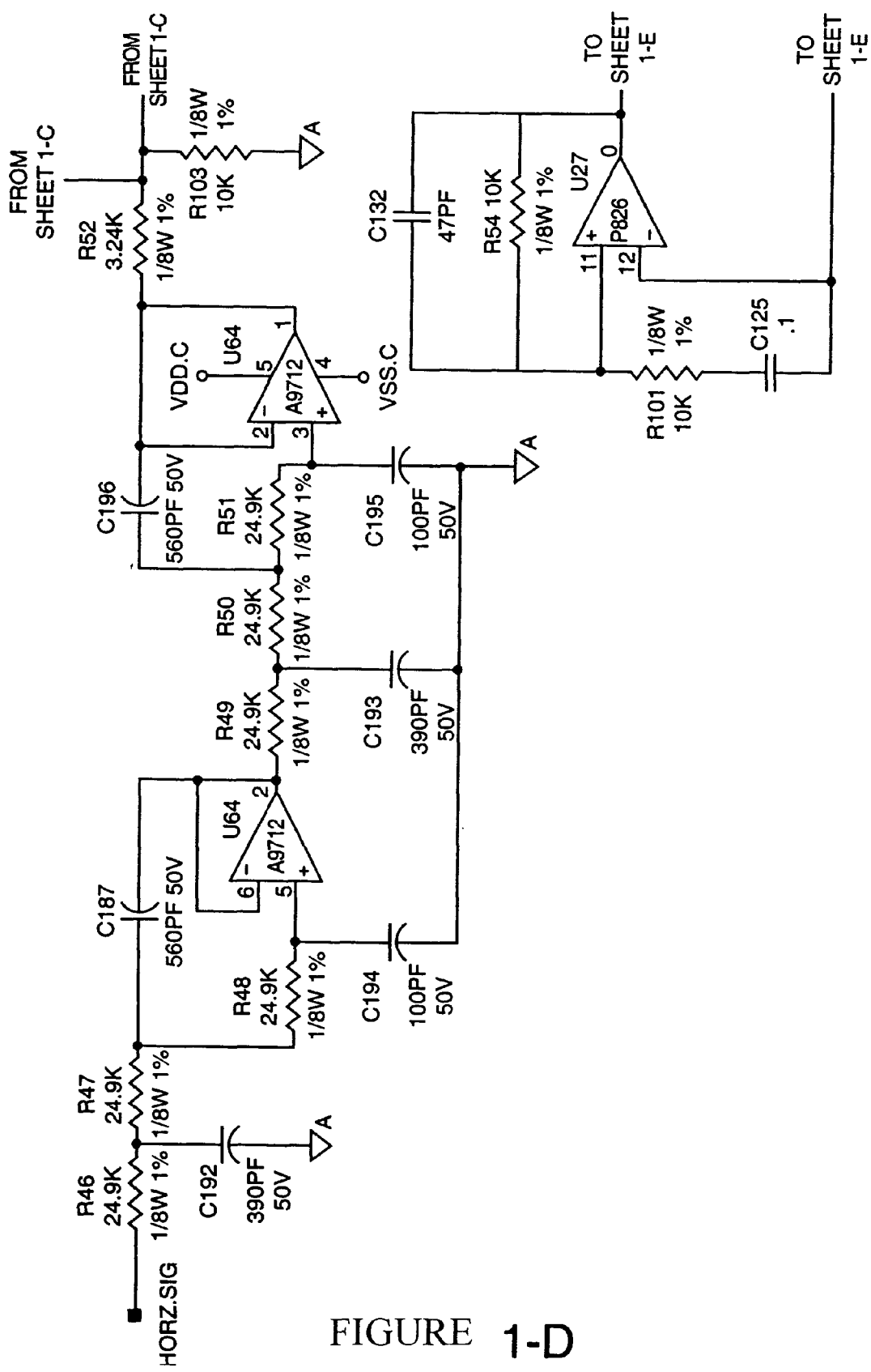
FIGURE 1-D

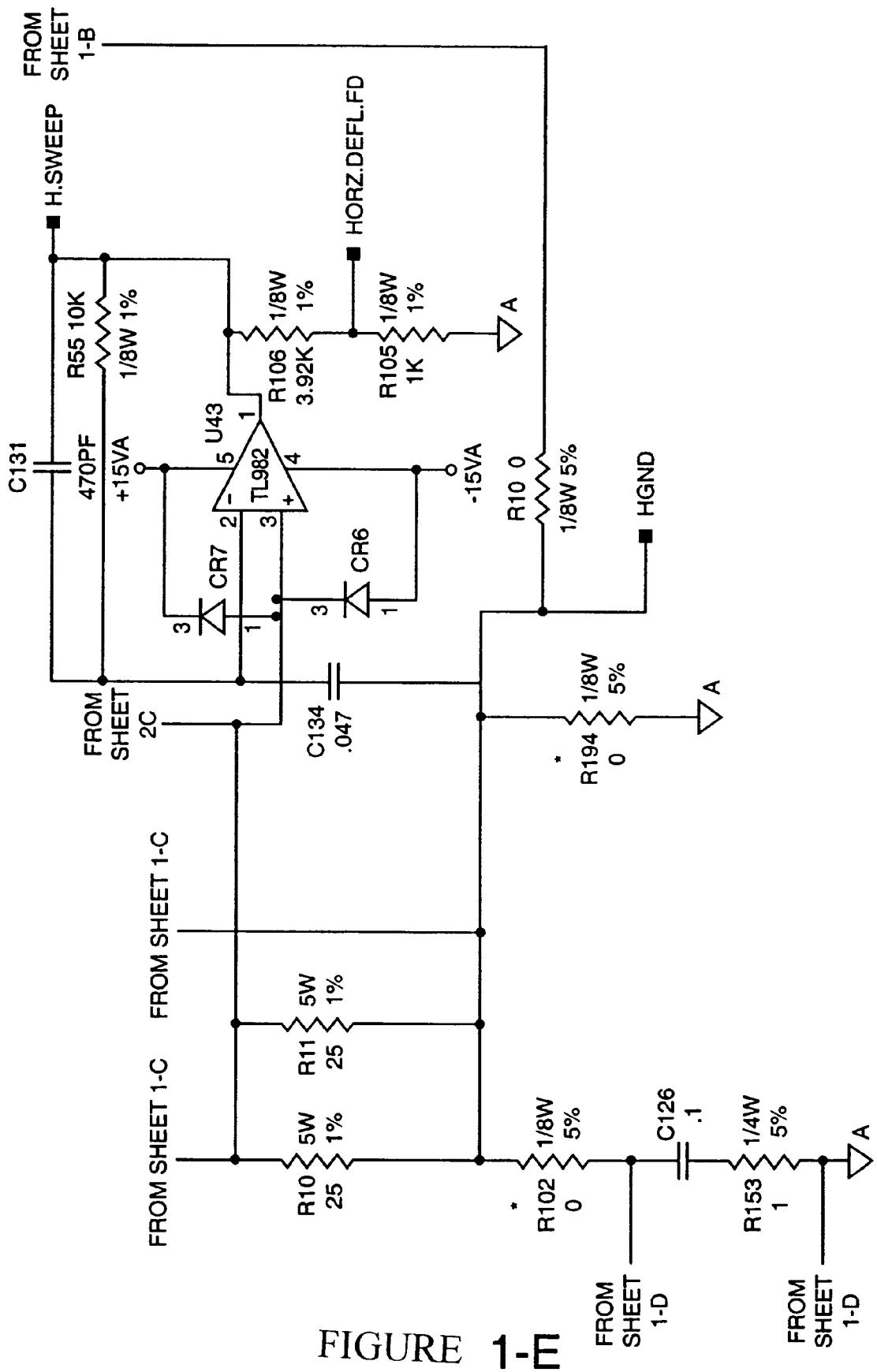
FIGURE 1-E

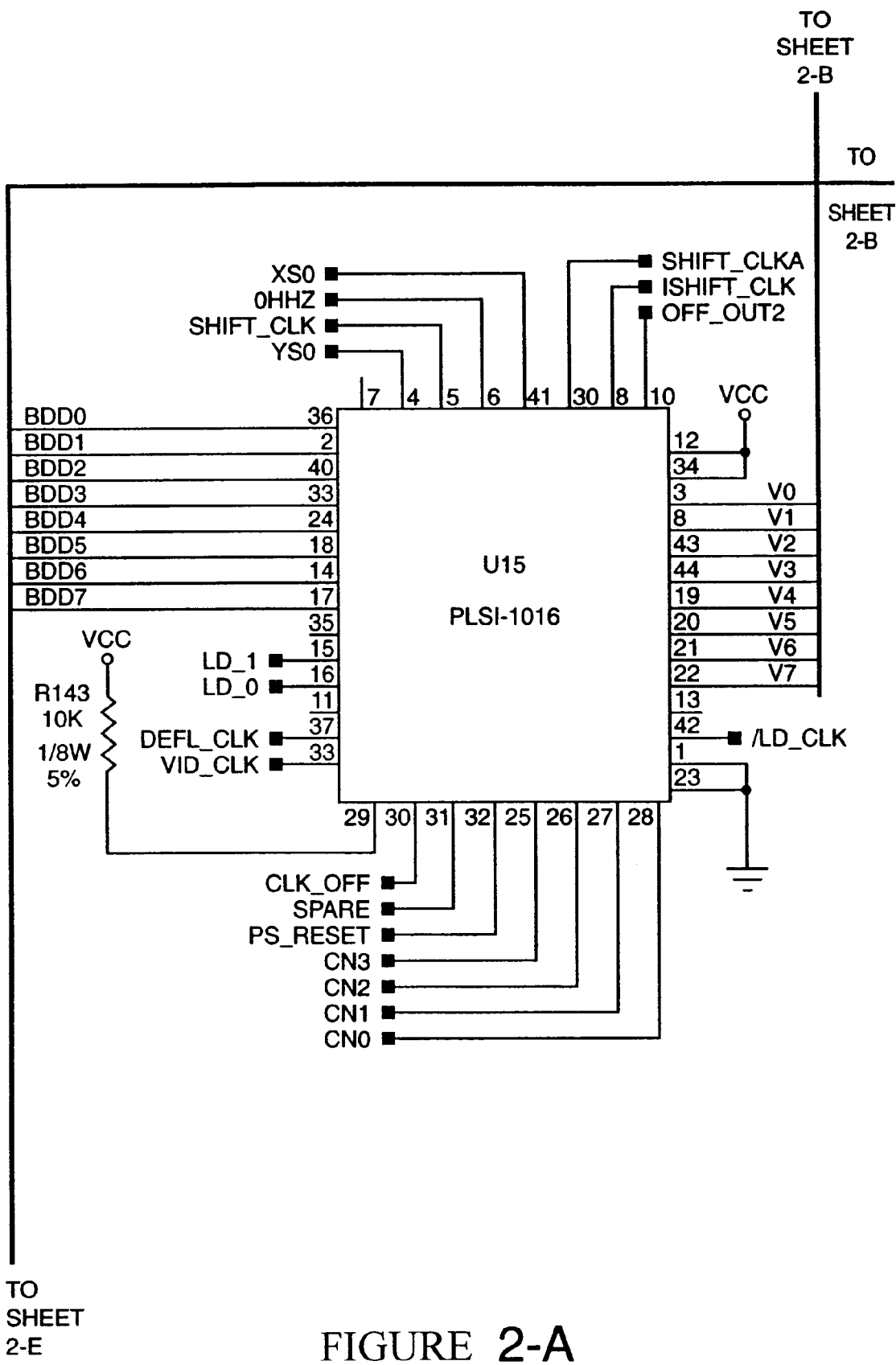
FIGURE 2-A

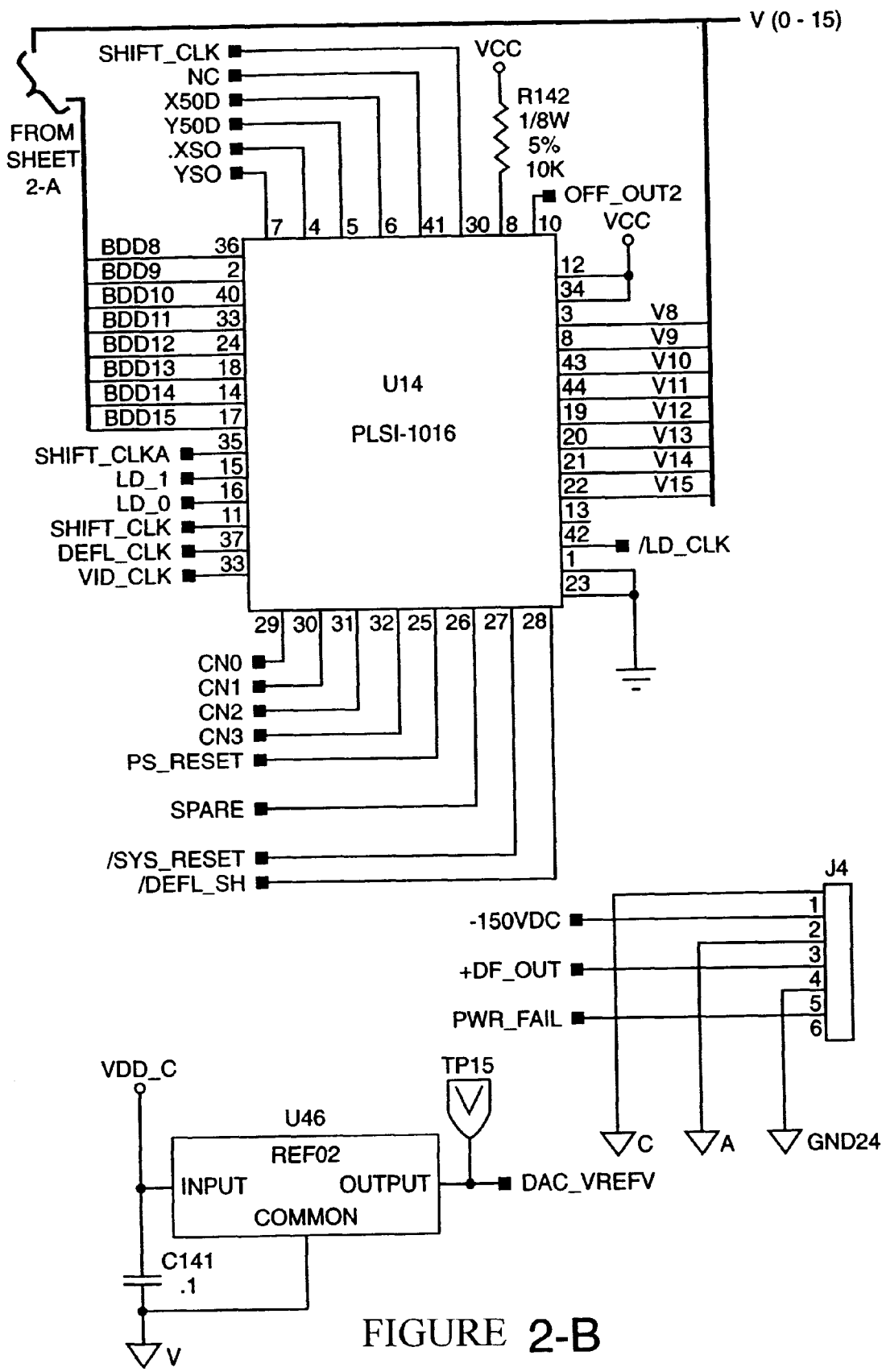
FIGURE 2-B

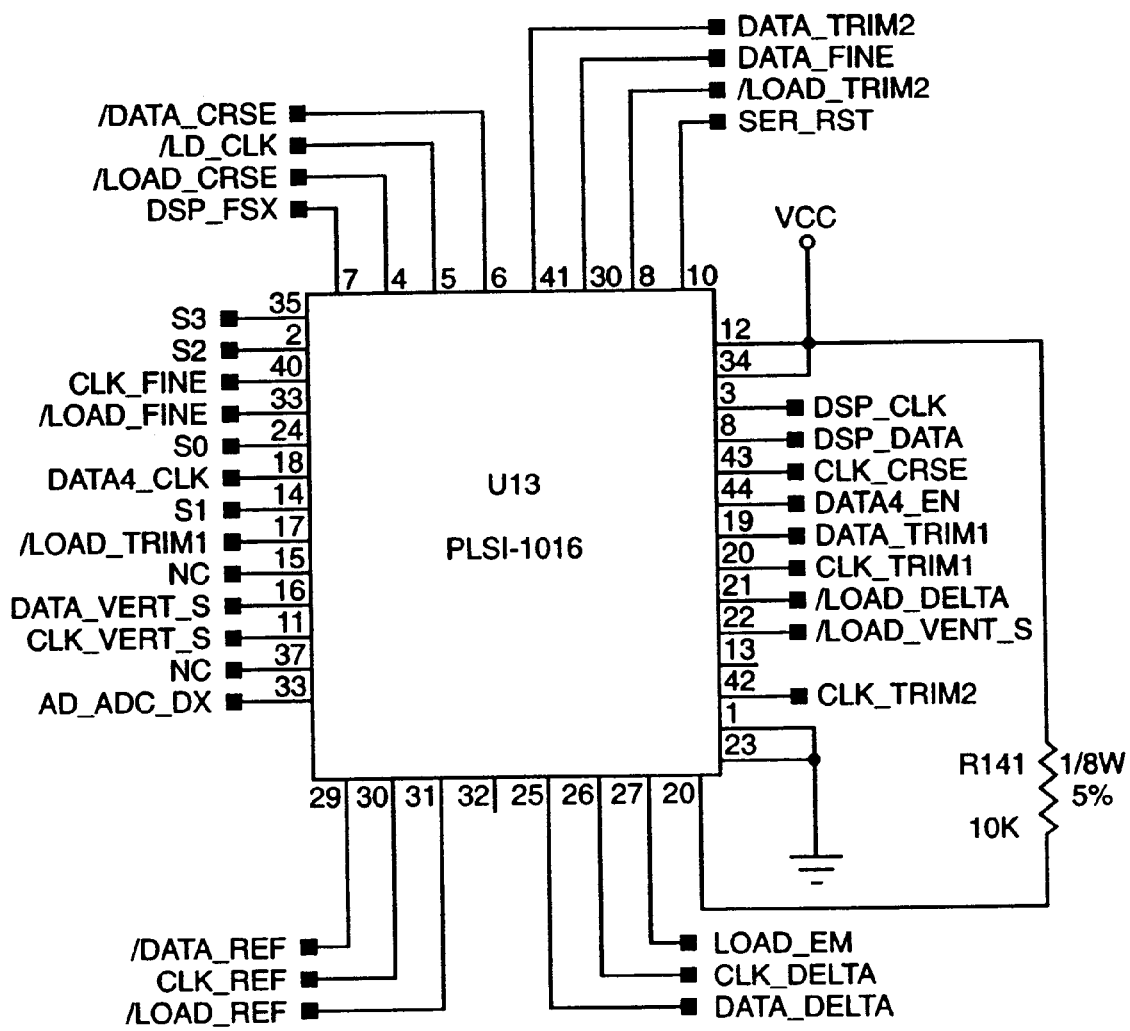
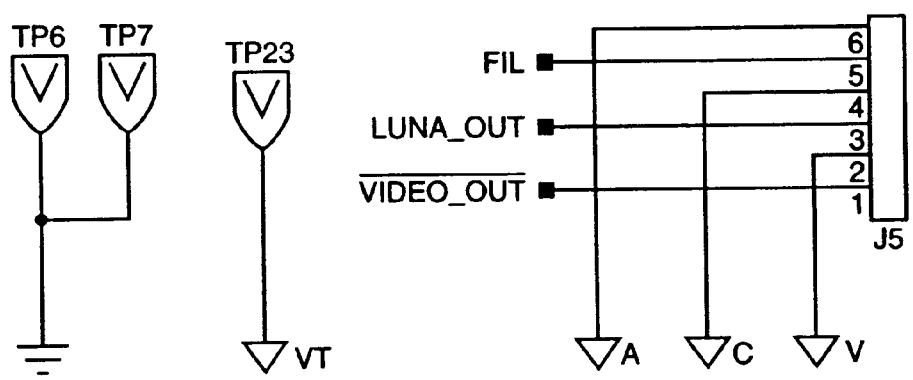
FIGURE 2-C

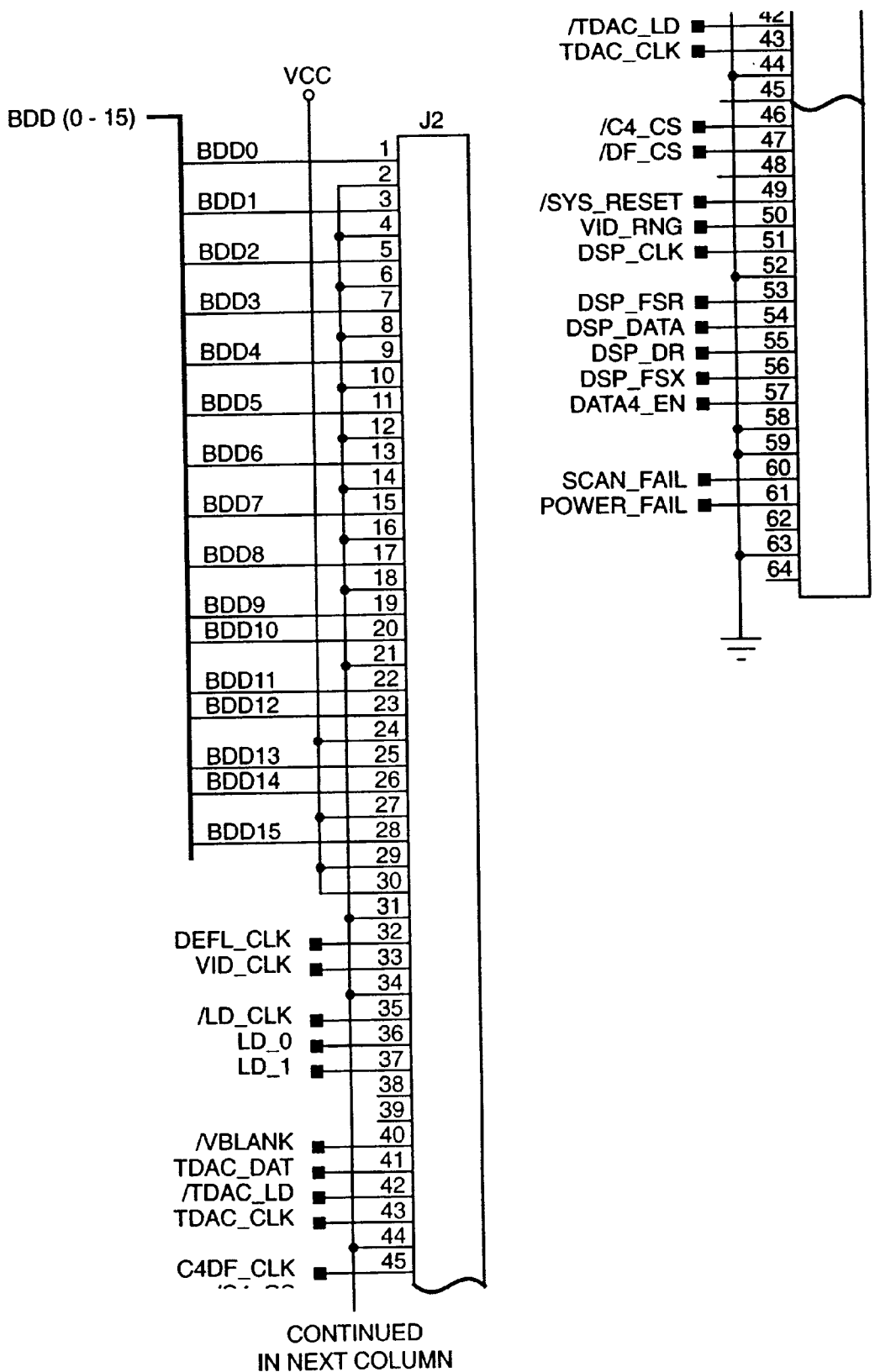
FIGURE 2-D

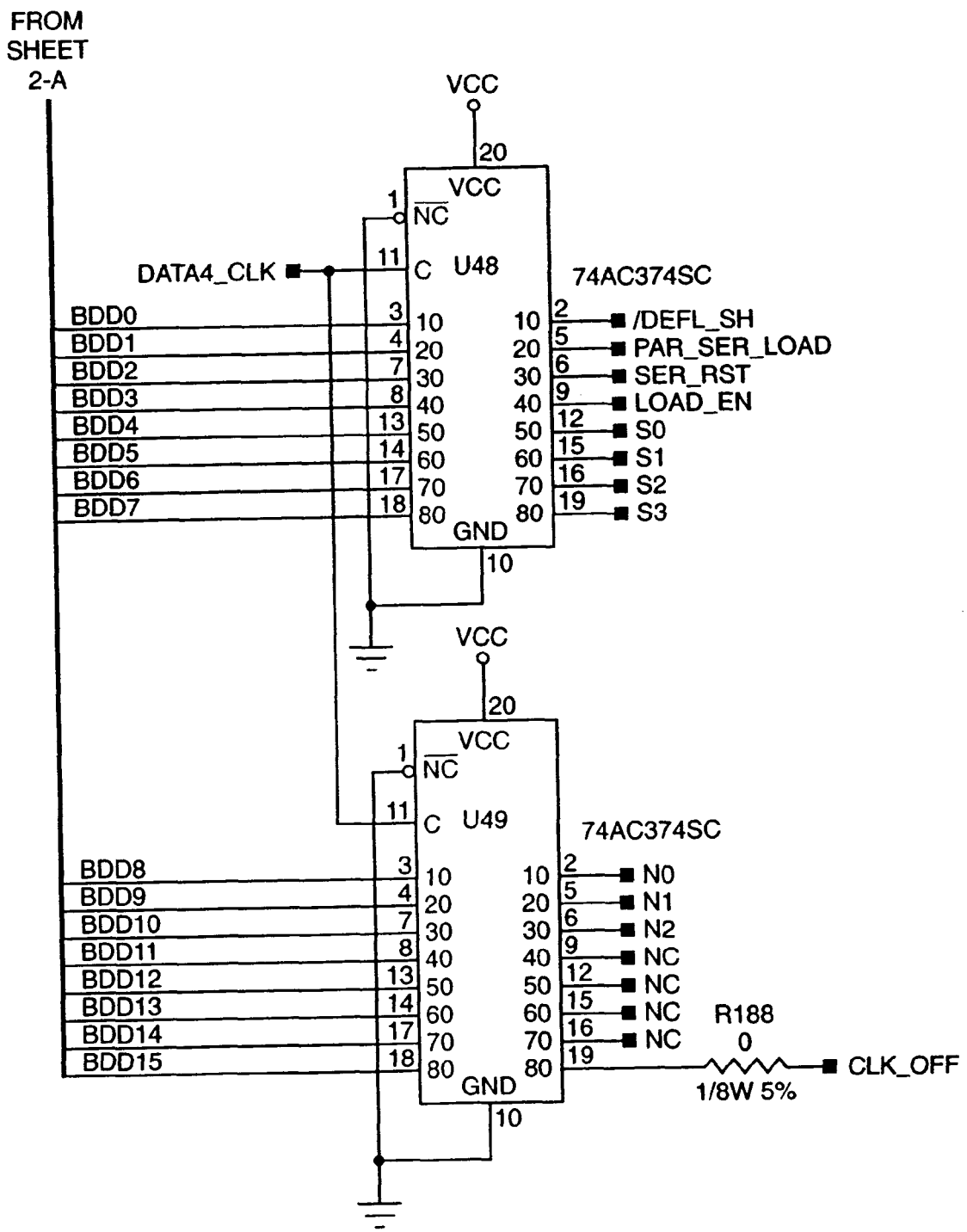
FIGURE 2-E

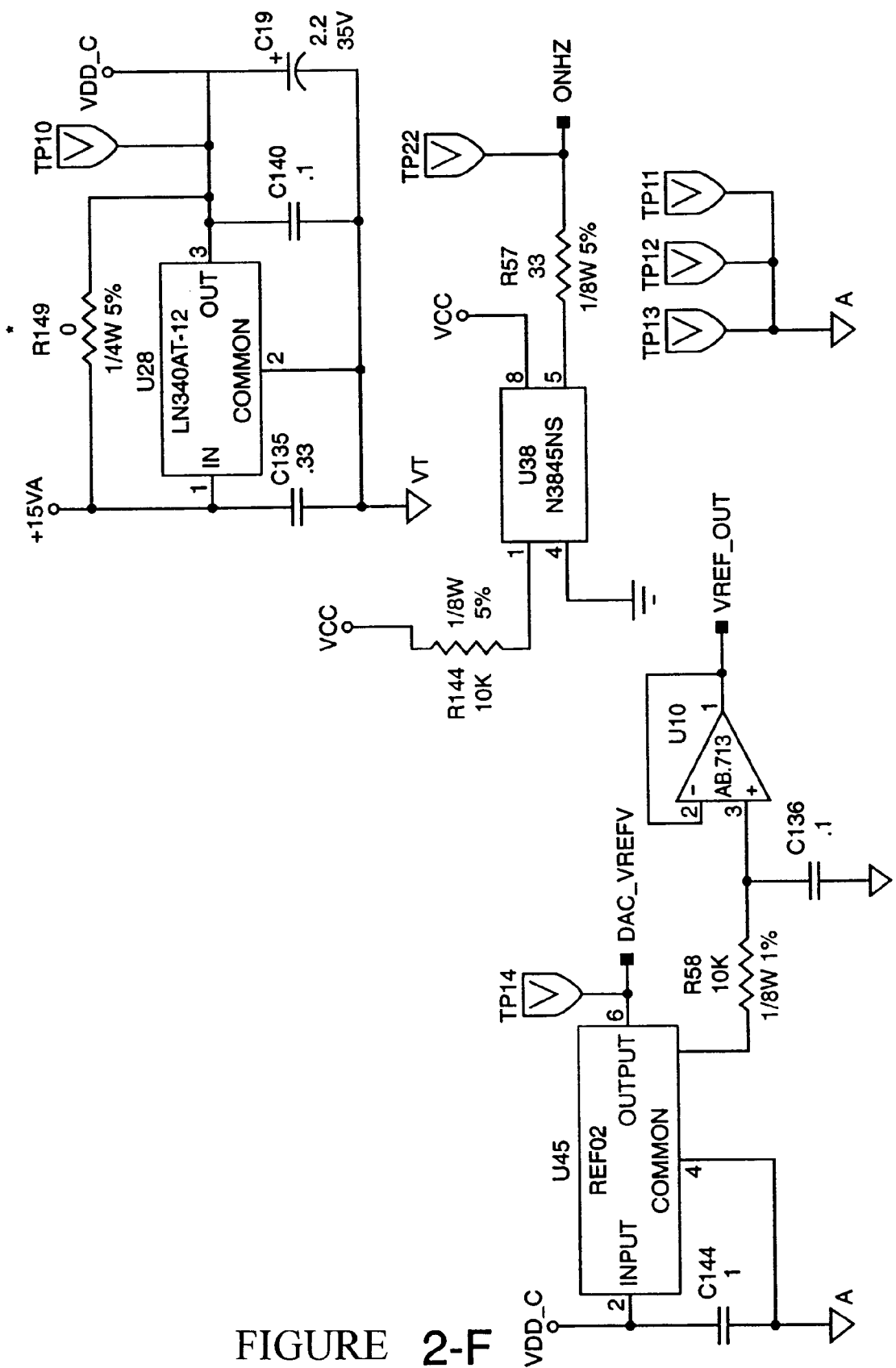
FIGURE 2-F

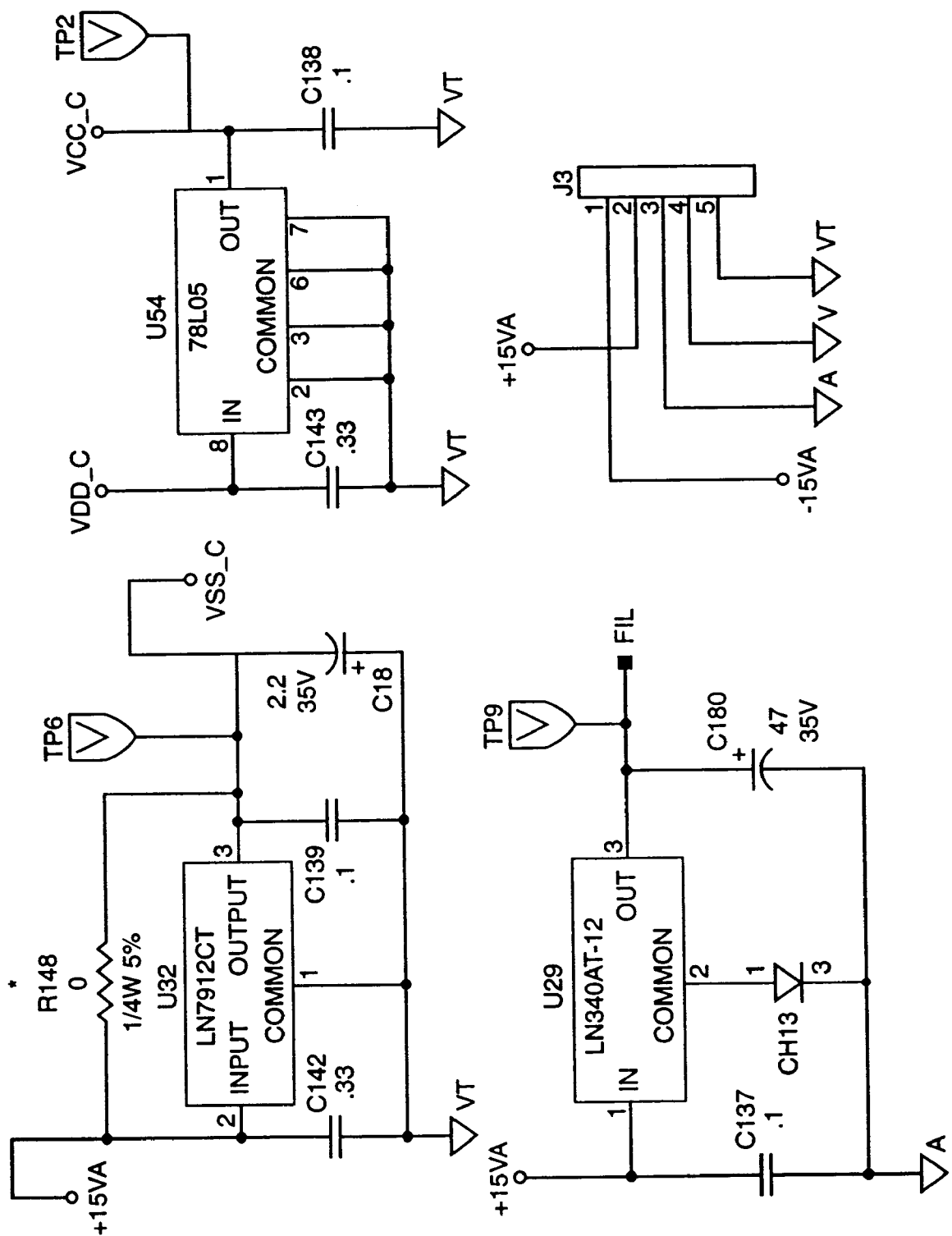
FIGURE 2-G

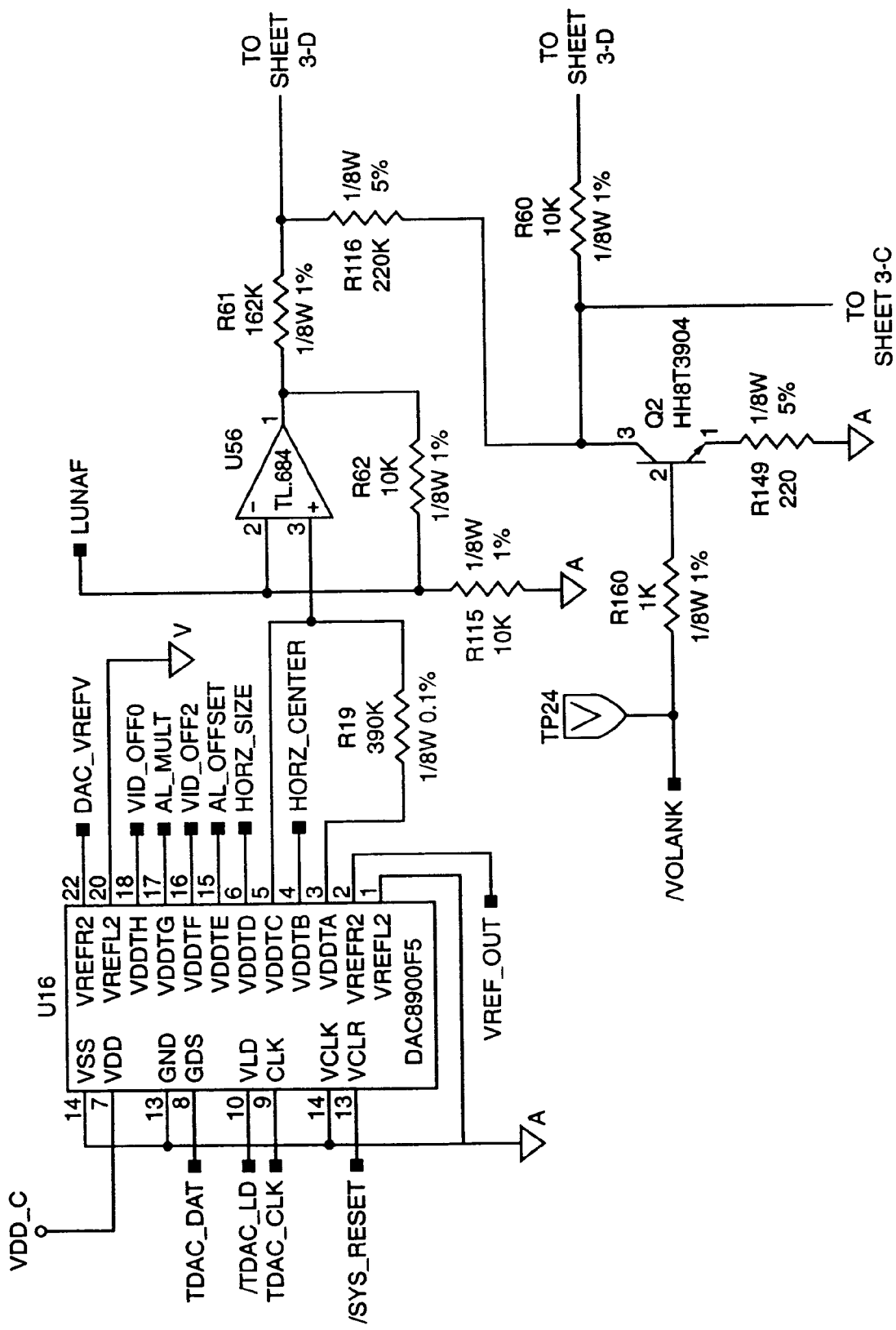
FIGURE 3-A

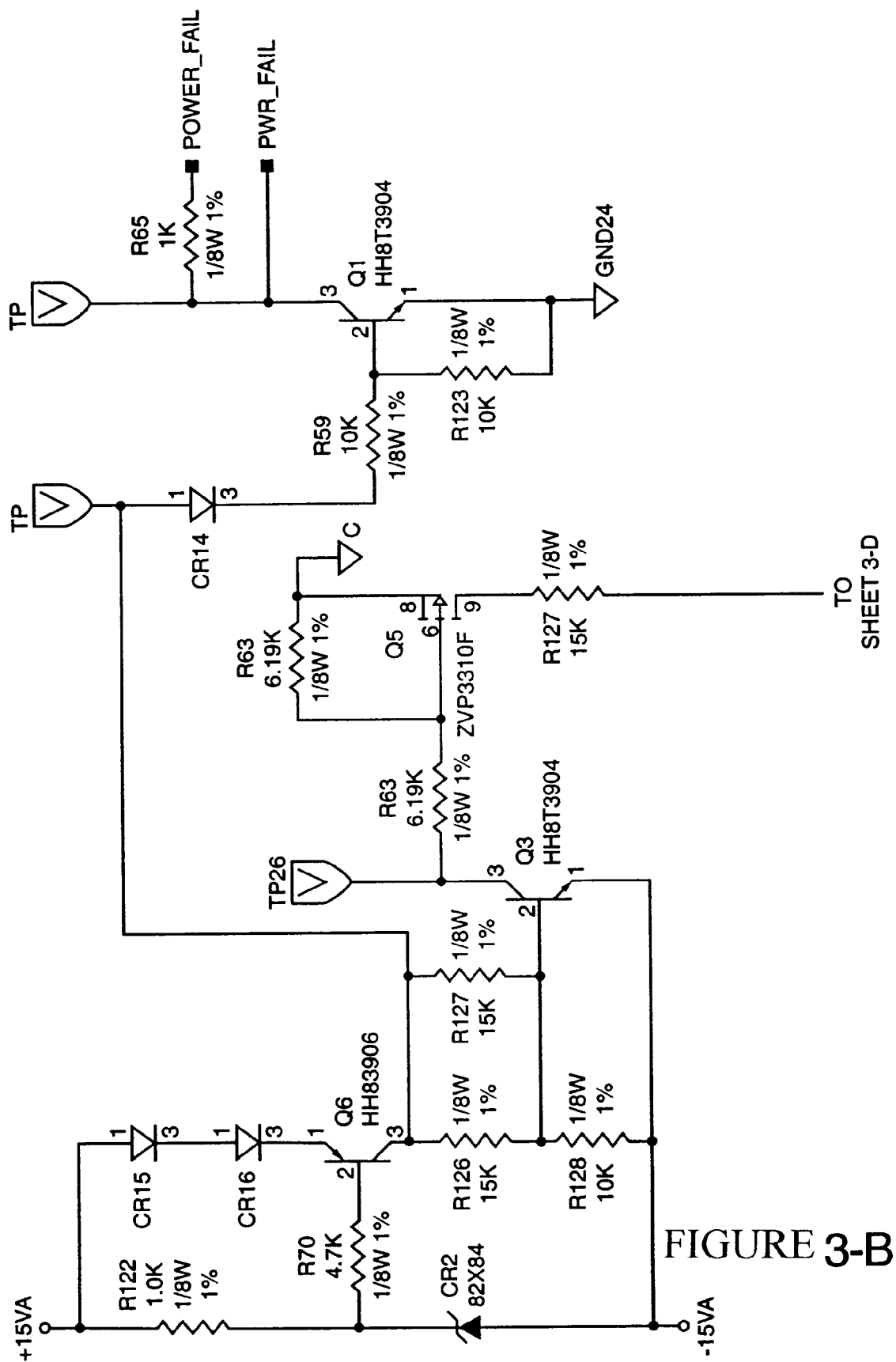
FIGURE 3-B

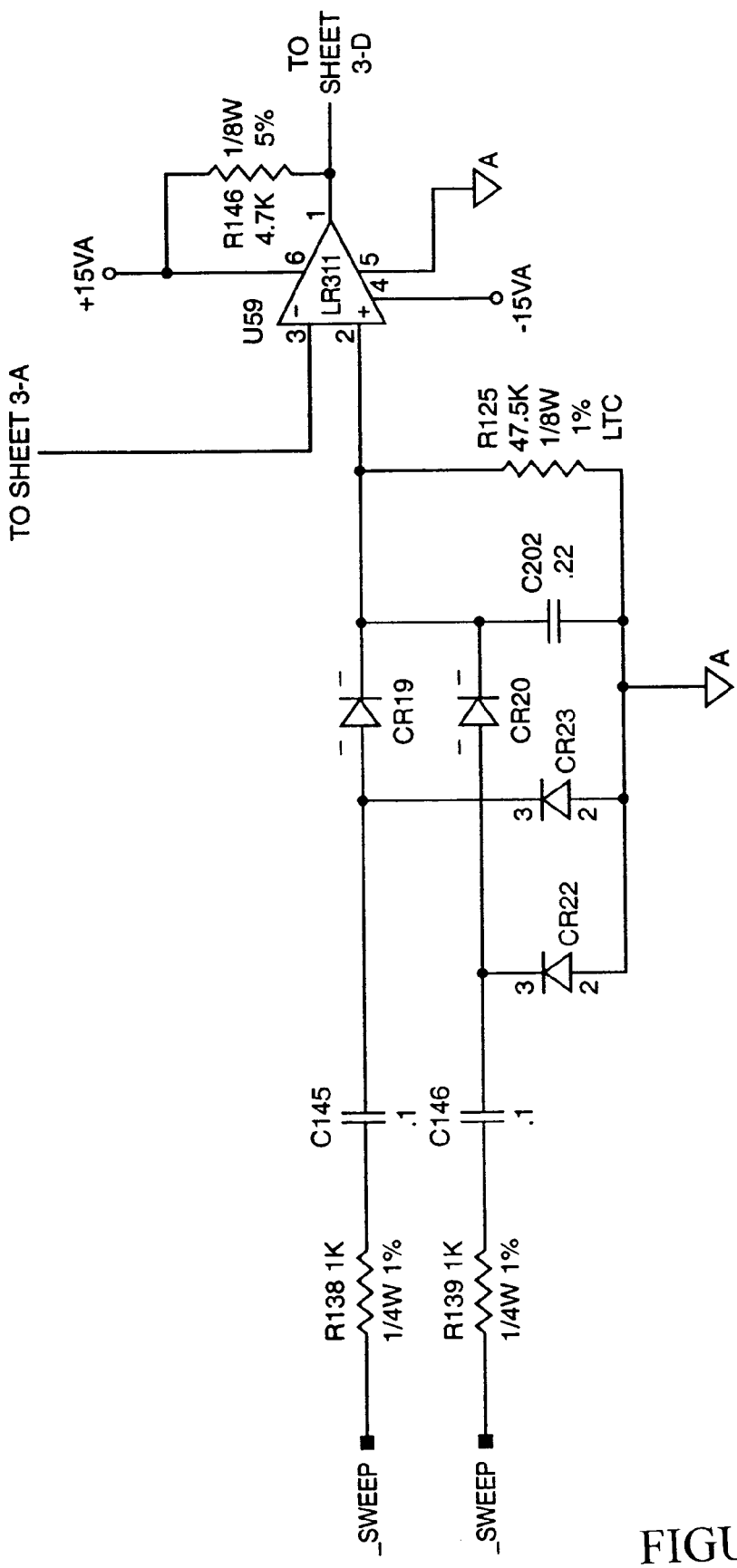
FIGURE 3-C

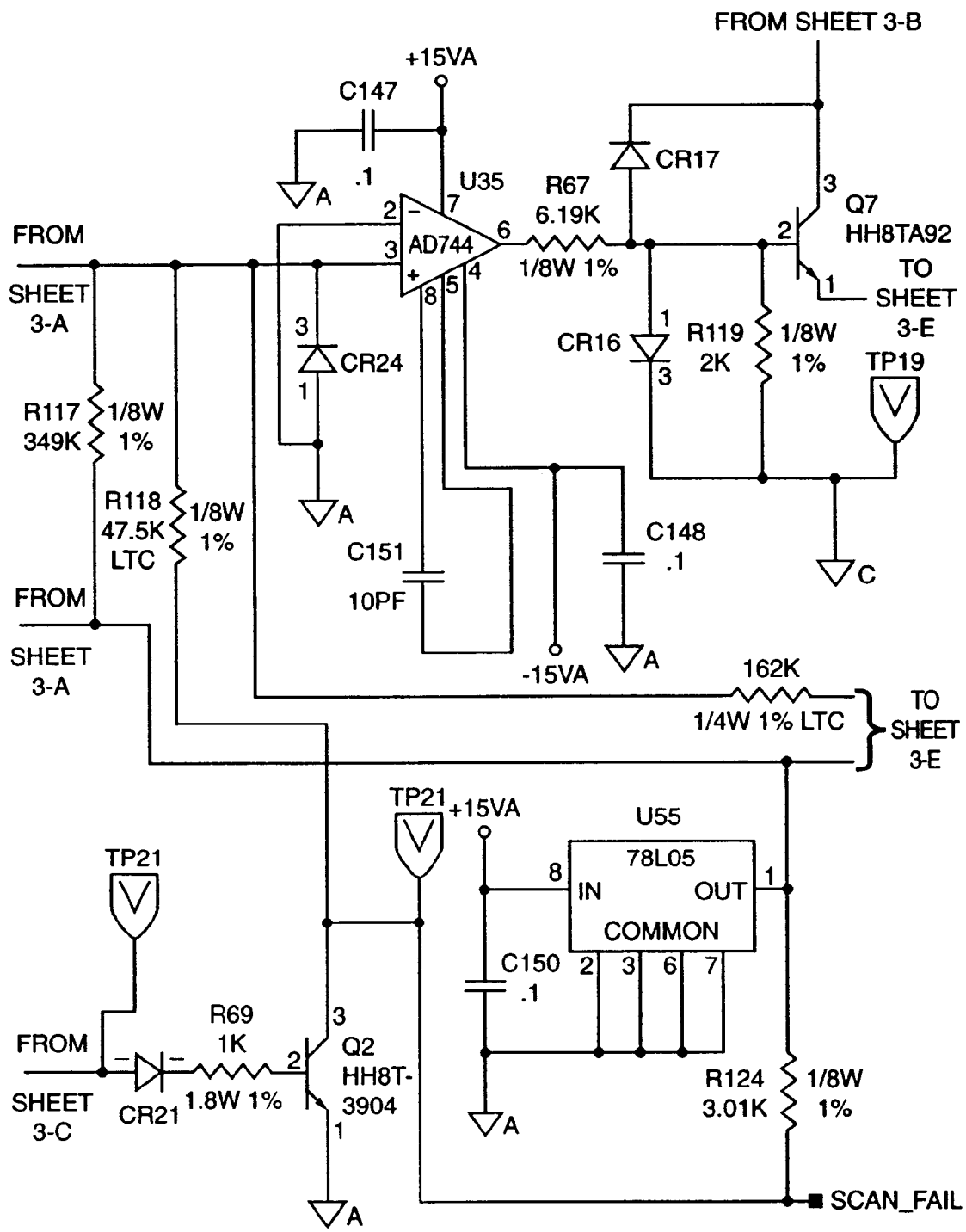
FIGURE 3-D

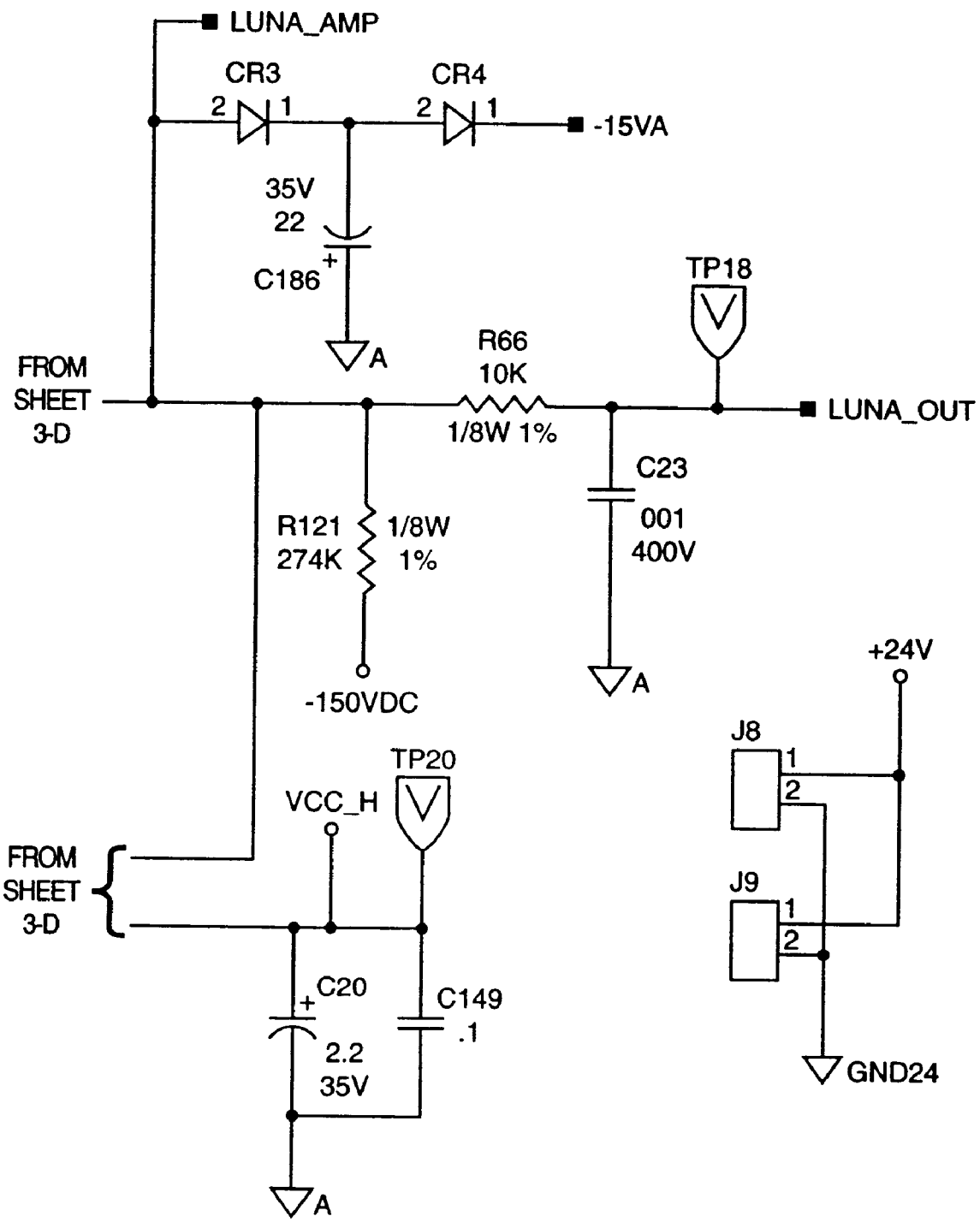
FIGURE 3-E

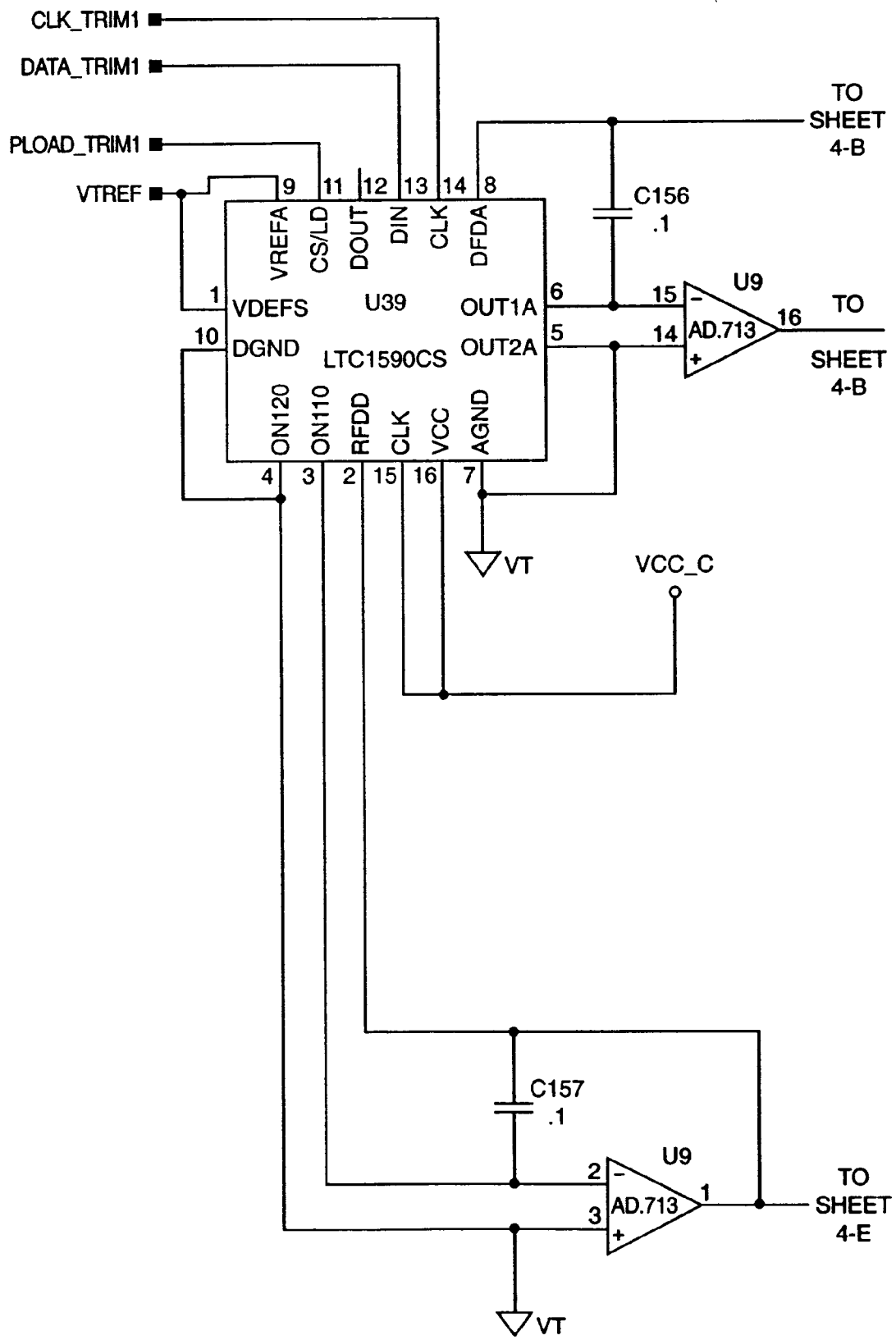
FIGURE 4-A

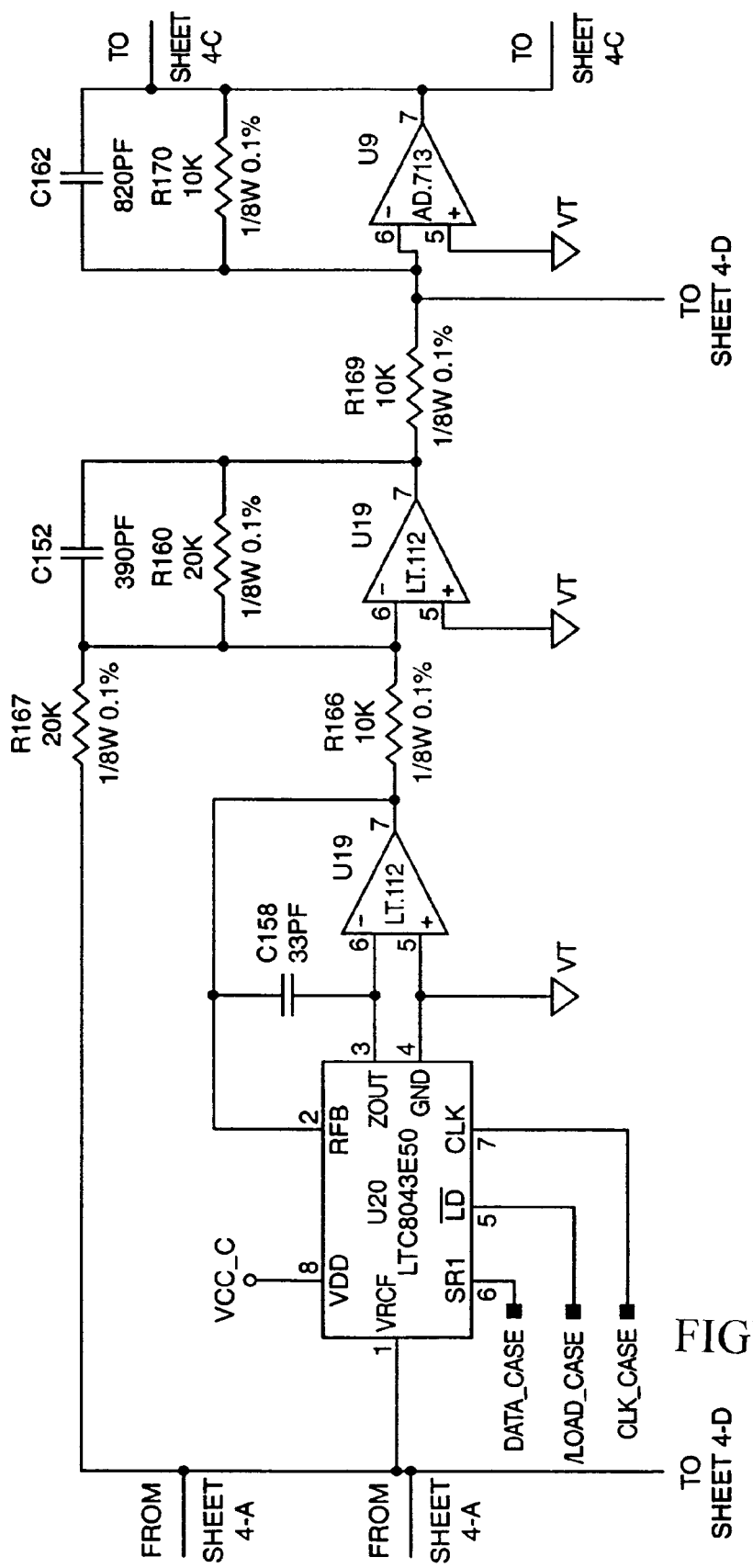
FIGURE 4-B

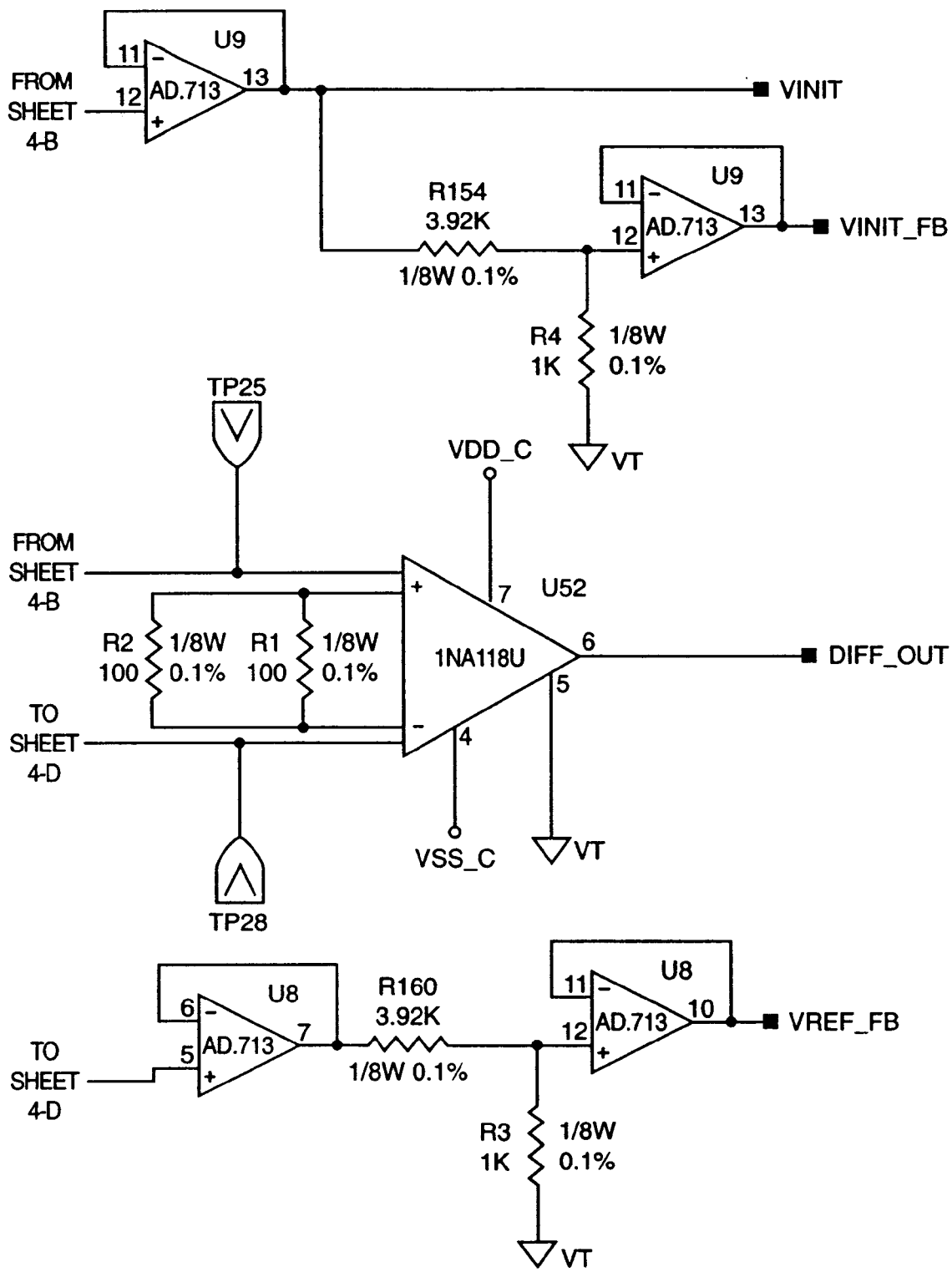
FIGURE 4-C

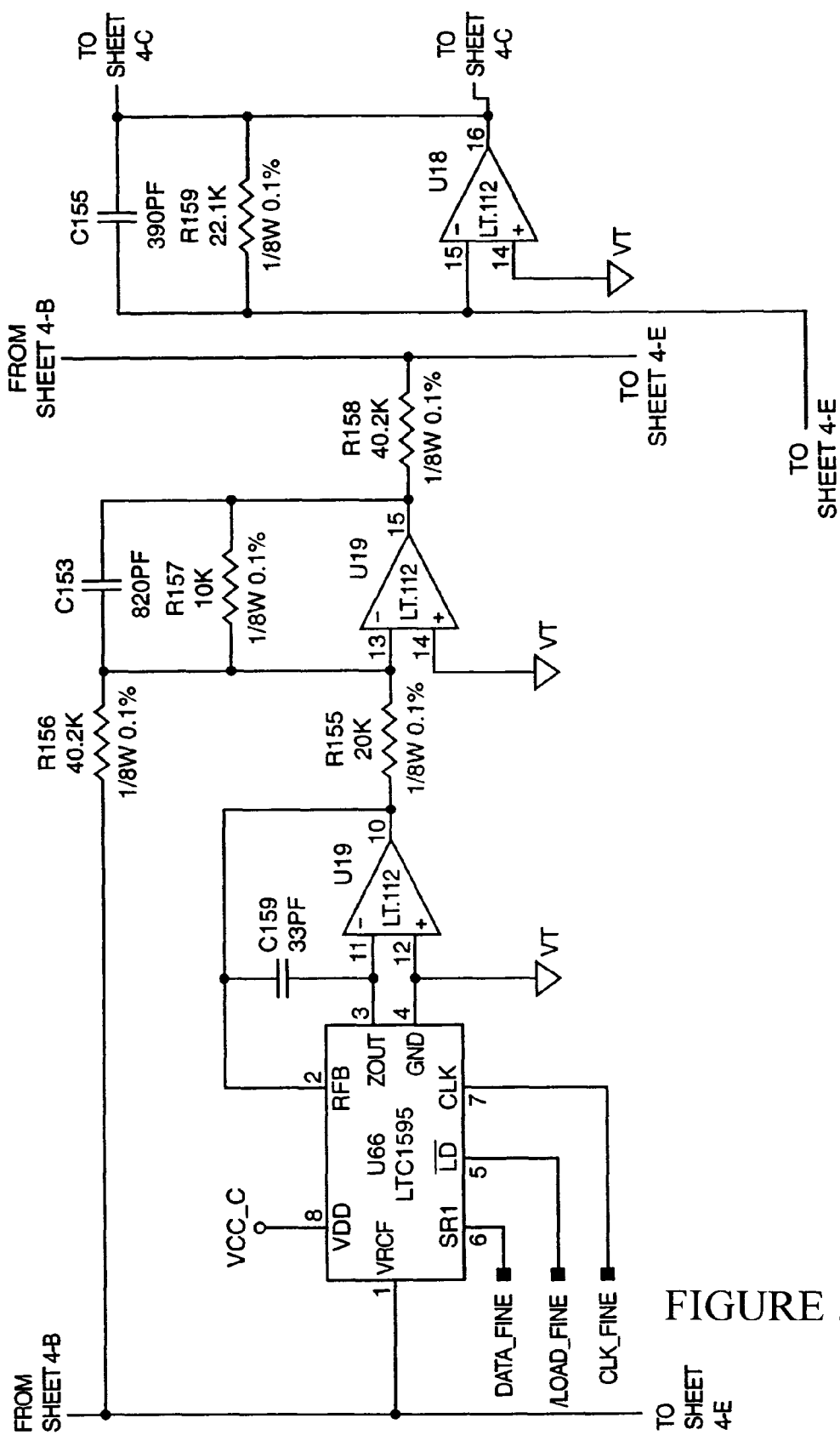
FIGURE 4-D

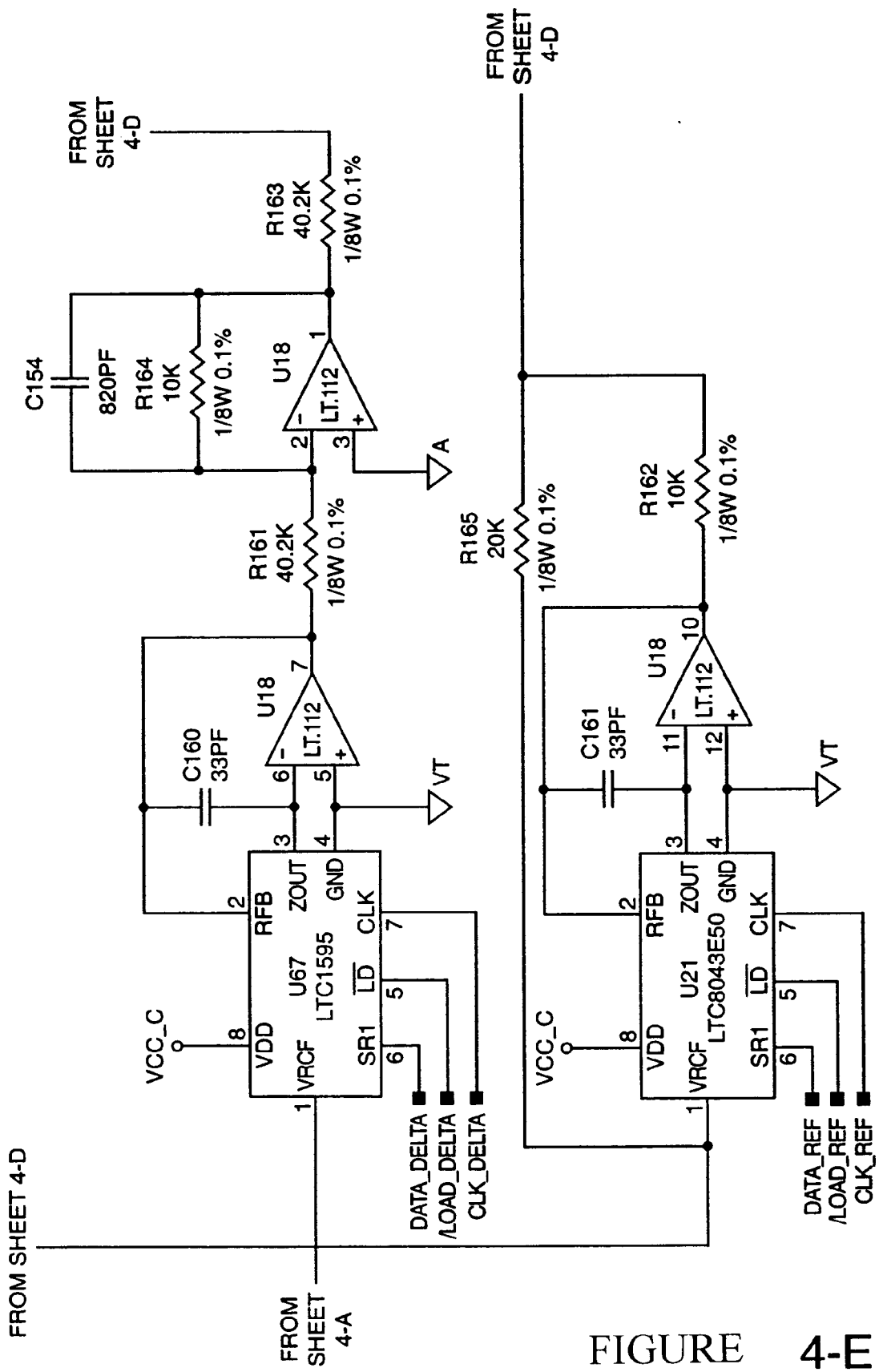
FIGURE 4-E

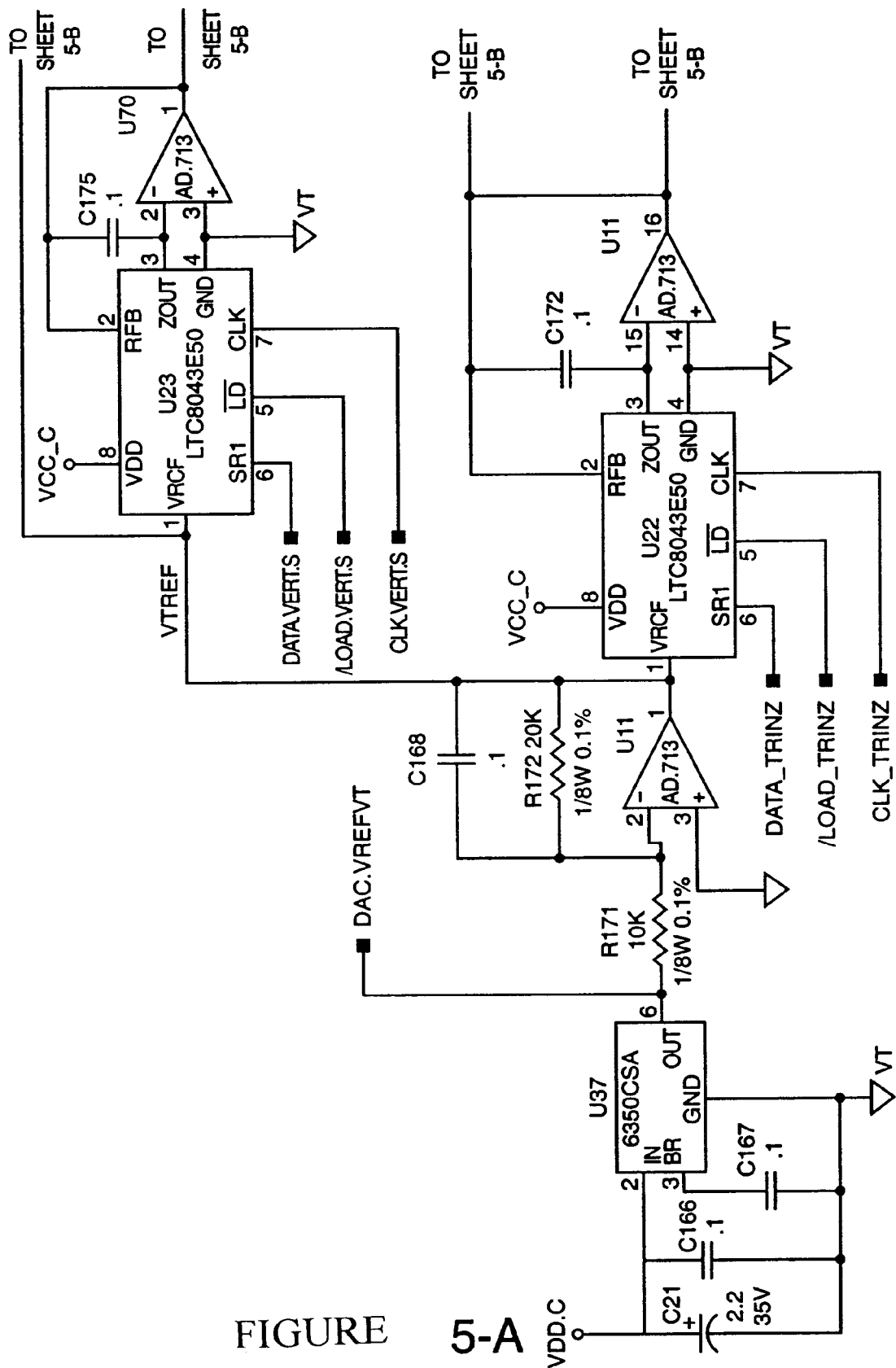
FIGURE 5-A

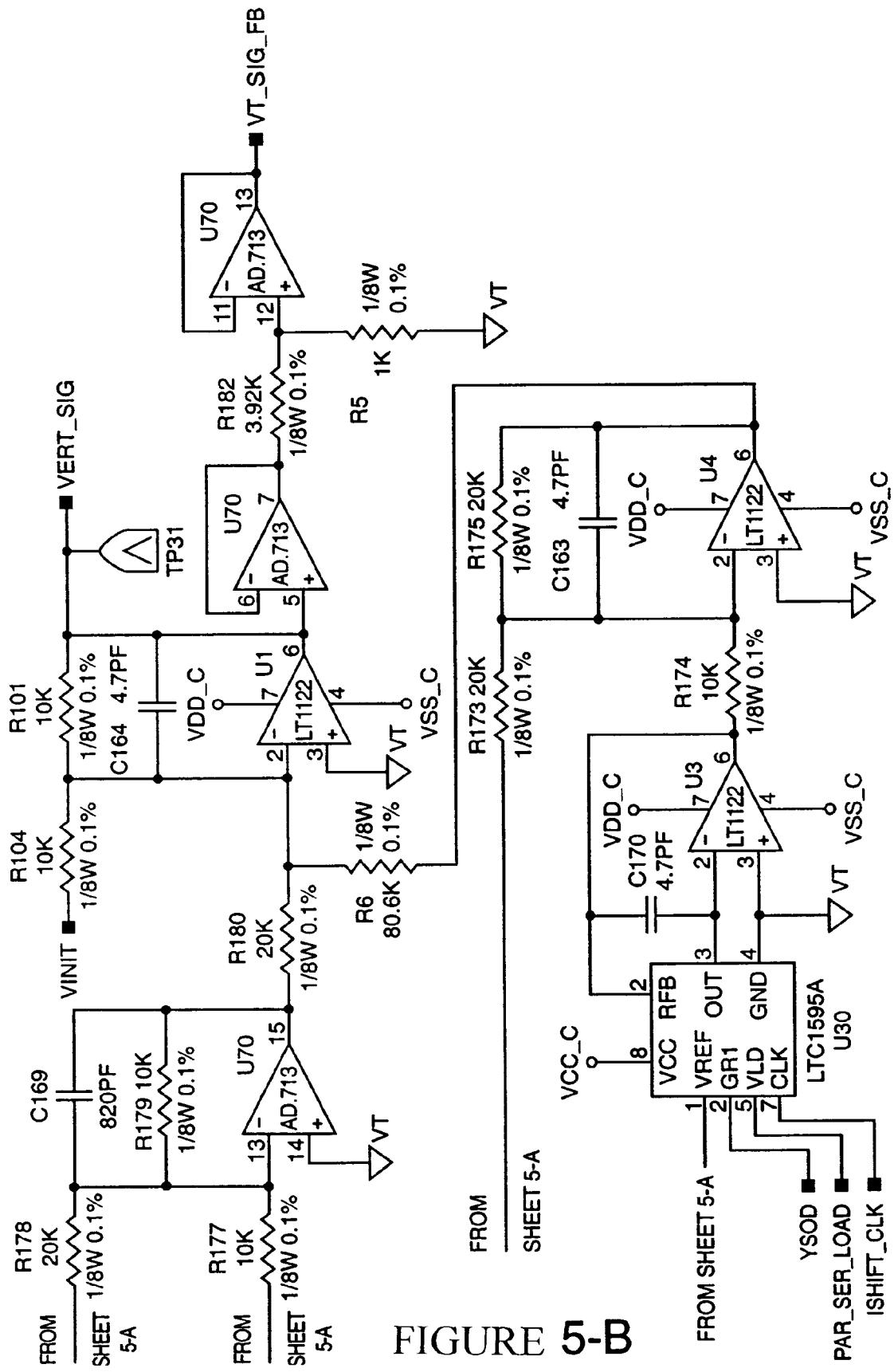
FIGURE 5-B

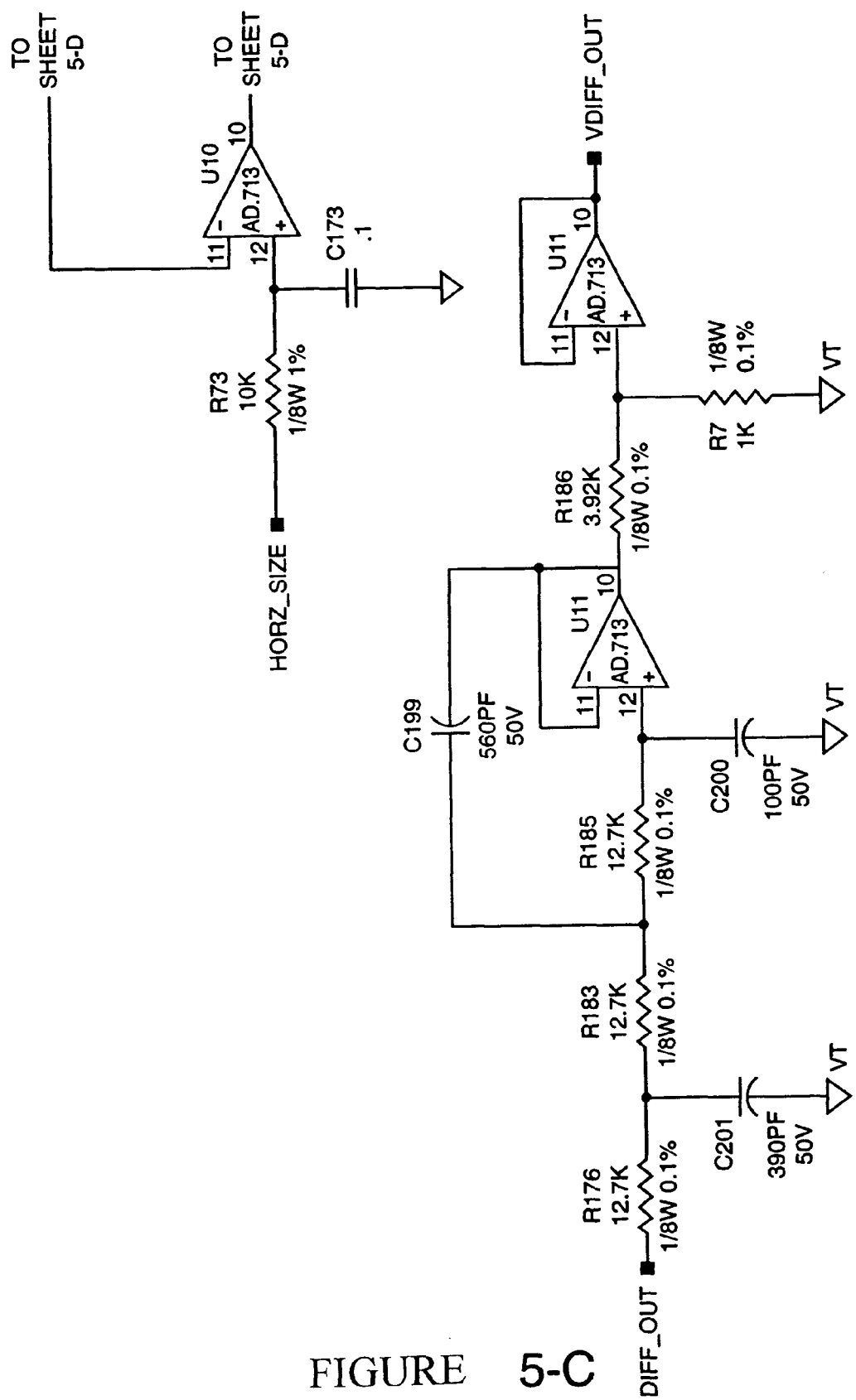
FIGURE 5-C

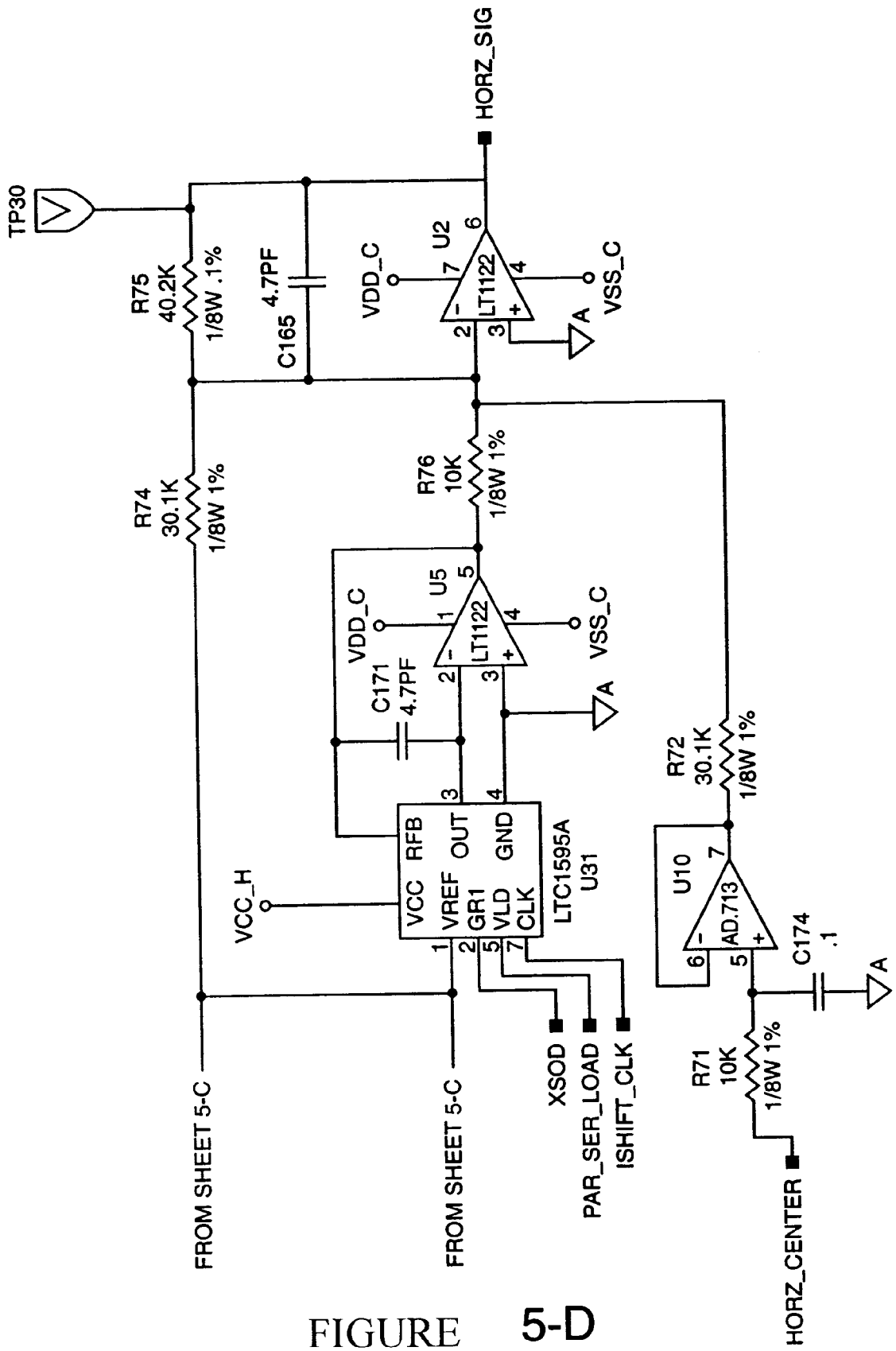
FIGURE 5-D

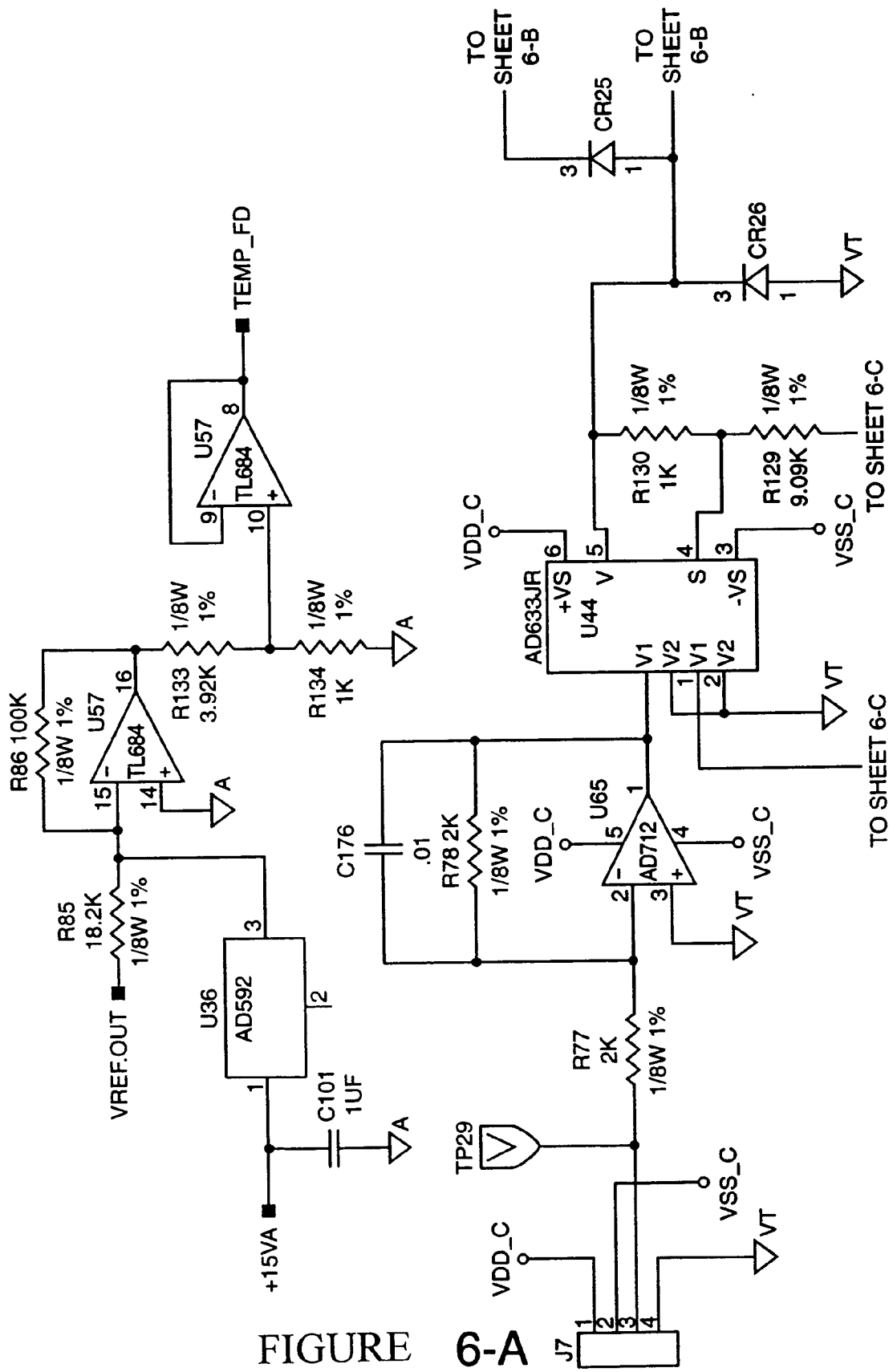
FIGURE 6-A

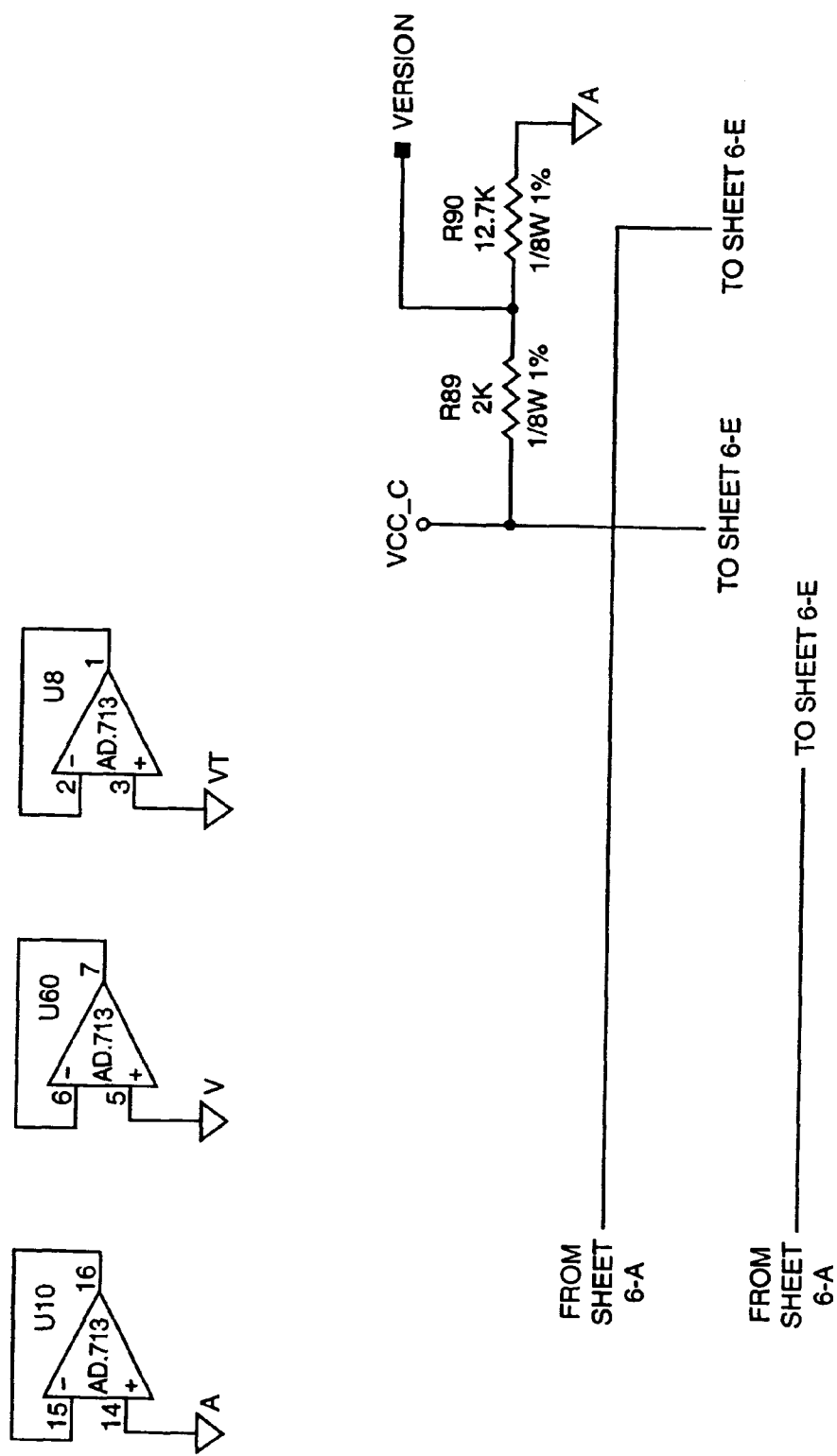
FIGURE 6-B

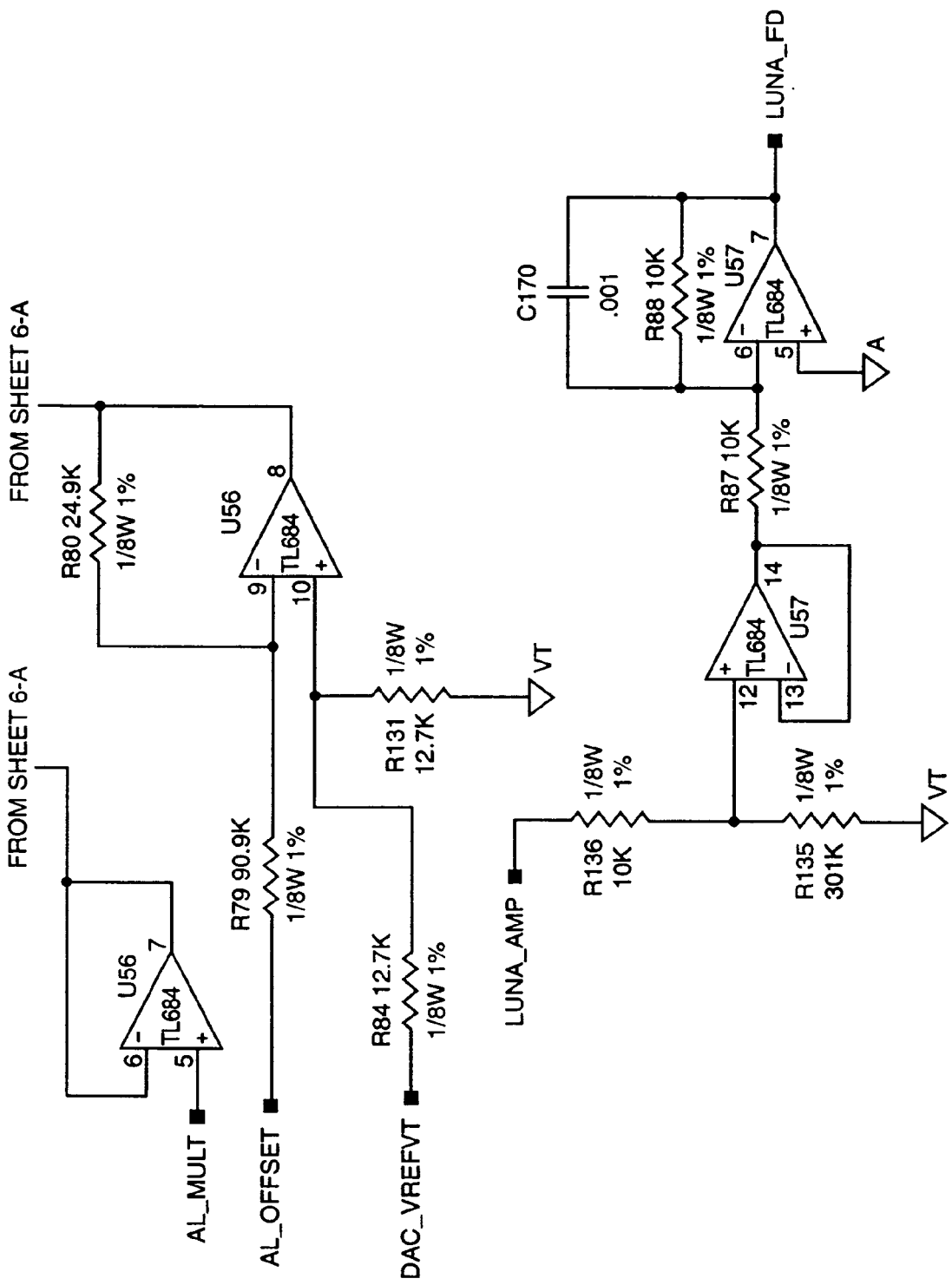
FIGURE 6-C

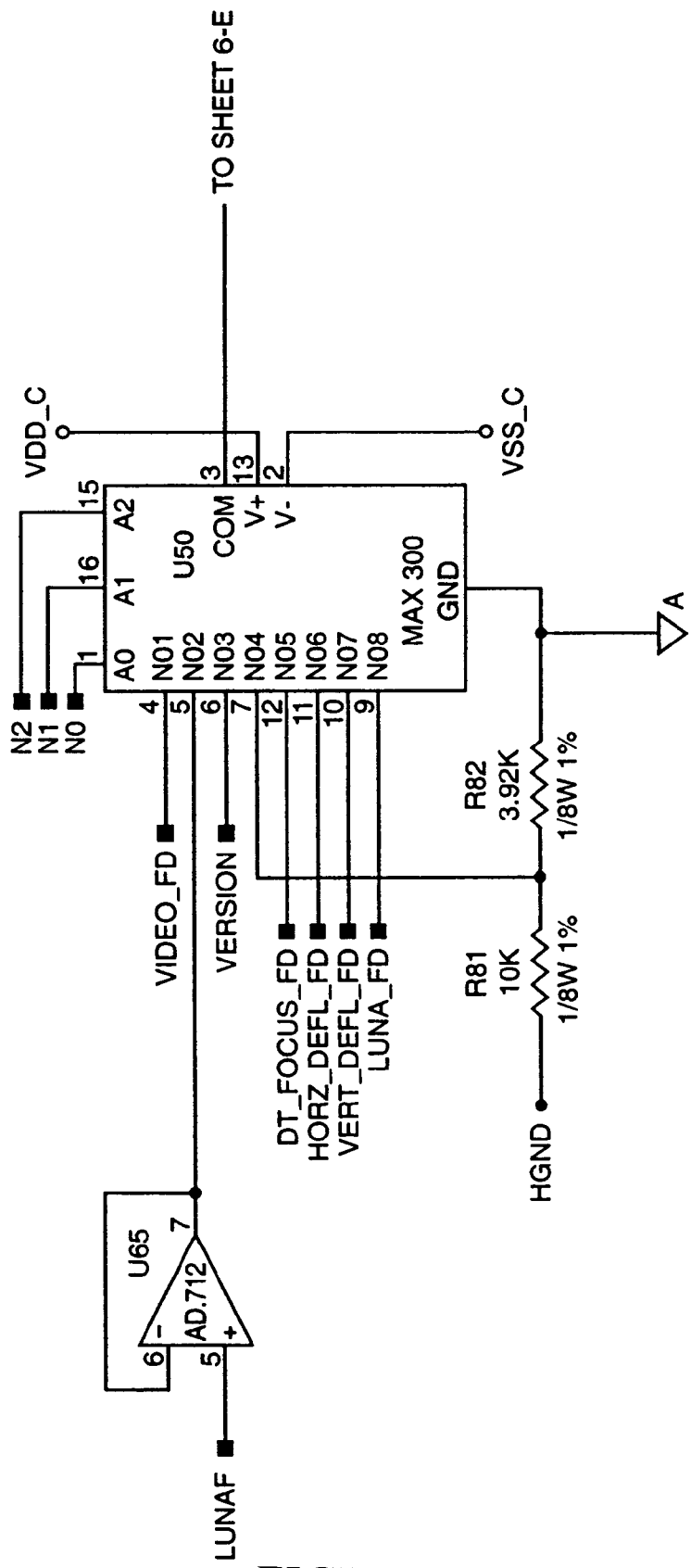
FIGURE 6-D

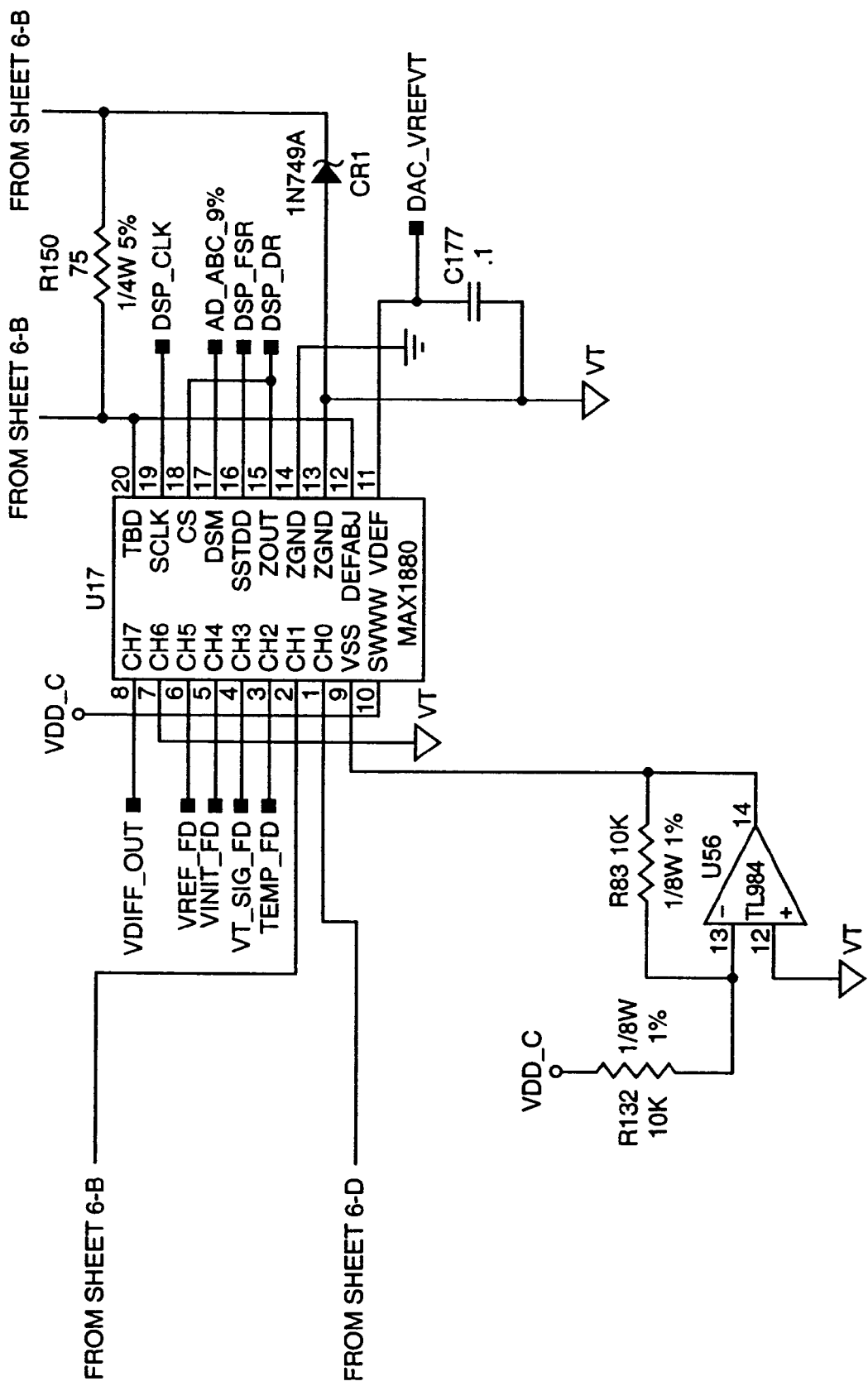
FIGURE 6-E

US 6,232,904 B1

SCANNING SYSTEM FOR FILM RECORDER

This application claims the benefit to the filing date under 35 USC 119(e) of provisional application No. 60/113,564, filed Dec. 23, 1998.

BACKGROUND OF THE INVENTION

1. Field of the Invention

This invention in general relates to the field of film recorders and, in particular, to a vertical deflection system suitable for use in scanning systems for film recorders.

2. Description of the Prior Art

Scanning-type film recorders and printers produce an image by printing a line of image data at a time, building the image by drawing many sequential horizontal lines. A well-known method of printing on film, for example, uses a cathode ray tube (CRT) as the imaging light source. Positioning the CRT beam in the vertical dimension is commonly done with a digital-to-analog converter (DAC). Monolithic DACs typically have a maximum resolution of 16 bits. With 16 bits available to position the CRT beam in the vertical dimension, there are available 65,536 possible locations available for beam placement. In a high-resolution film recorder there can be as many as 6372 scan lines in an image (i.e., 8 k horizontal resolution with 4"×5" film). This means that if a single DAC is used for positioning the beam in the vertical dimension, there will be no more than a 10 least-significant-bit change from line-to-line of beam position values.

When creating a flat field image (e.g., a single color gray image) it has been found that line-to-line position errors need to be less than 5% of the line-to-line distance in order that individual scan lines not be perceived as horizontal lines in the image. With a 16-bit DAC system there are at least two sources of errors. One source is the rounding off of data in the generation of the vertical deflection data. This occurs because film recorders accept images of any horizontal resolution from 512 to 8192, and the line-to-line distance may not be an integer value of 16 bits. There may be rounding-off errors as large as one least significant bit (LSB).

The second error type comprises differential non-linearity errors in the DAC transfer function of at least one LSB. A one LSB error will give a line-to-line error of about 10%, which results in visually-perceived horizontal lines in the image. Thus, a vertical deflection system with a line-to-line resolution of greater than 16 bits is necessary to create a flat field image that is free from horizontal line artifacts. At a vertical resolution of 6372, 19 bits of resolution will give a line-to-line error of 1.2% for a one LSB error.

SUMMARY OF THE INVENTION

By using a plurality of DACs, including a delta DAC comparison configuration, the vertical deflection resolution of a film recorder can be increased from 16 to 19 bits. The problem of producing a flat-field image at a high resolution is addressed by an incrementing and re-indexing process which utilizes the delta DAC comparison data in a vertical deflection system.

BRIEF DESCRIPTION OF THE DRAWINGS

The structure and operation of the invention, together with other objects and advantages thereof, may best be understood by reading the detailed description to follow in connection with the drawings wherein.

DESCRIPTION OF THE PREFERRED EMBODIMENTS

A conventional computer graphics systems typically comprises a computer or central processing unit, a graphics display generator which takes commands from the host computer and generates the graphic image usually in the form of a red, blue and green video analog signal for use by a color CRT, a color CRT for viewing the graphics image, and some sort of a hardcopy film recorder device. See, for example, U.S. Pat. No. 4,704,699 "Digital film recorder, peripheral, and method for color hardcopy production," issued to Farina et al., and U.S. Pat. No. 4,769,715 "Digital image display and photographic recording apparatus," issued to Feldman et al.

Figure 1A:
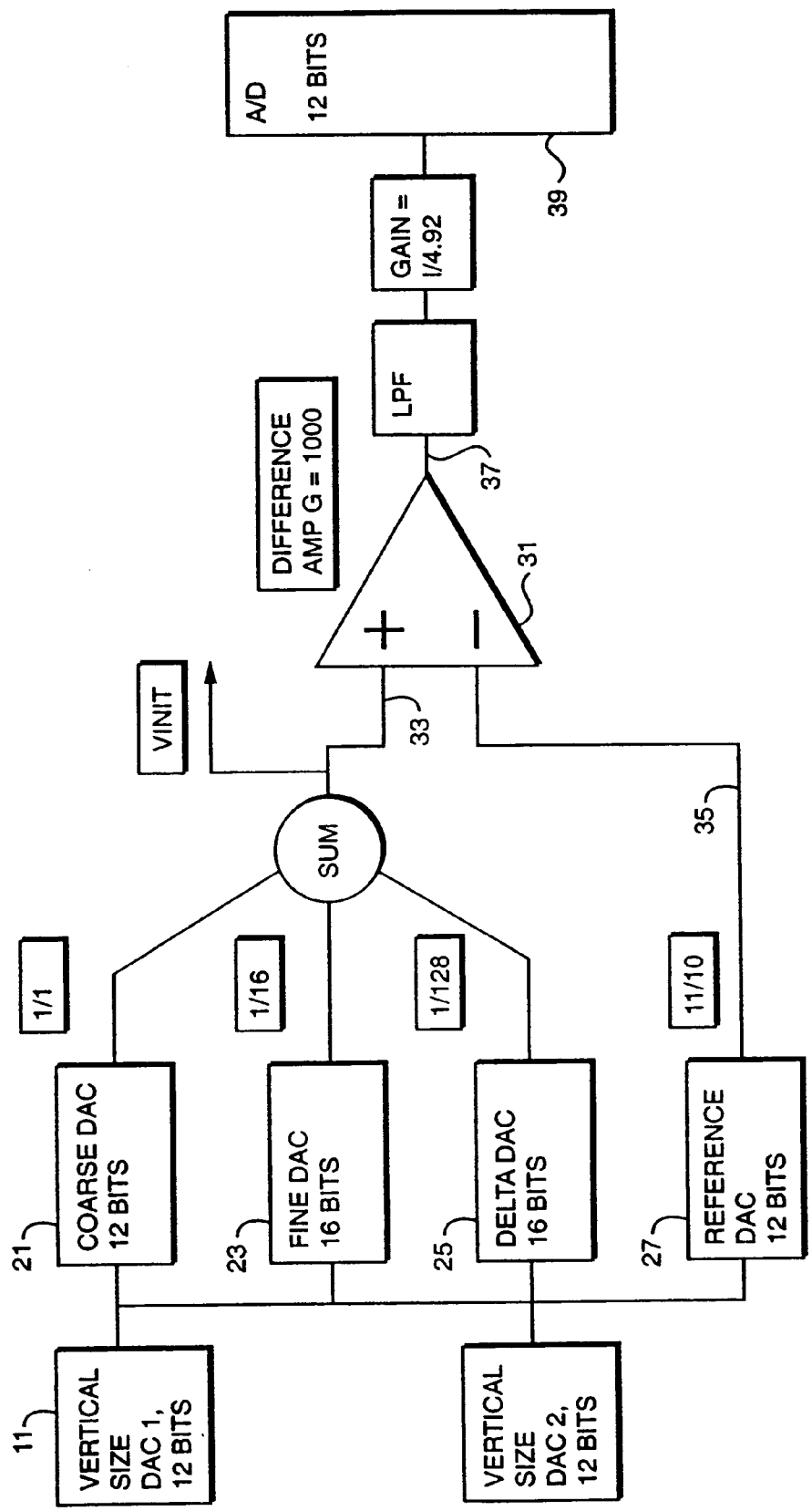
FIG. 1 is a simplified block diagram of a vertical deflection system in accordance with the present invention; and, Appendix sheets 1 through 8 provide a schematic diagram of the components comprising a scanning system, of which the vertical deflection system of FIG. 1 is a part, for a film recorder in accordance with the present invention.
Figure 1B:
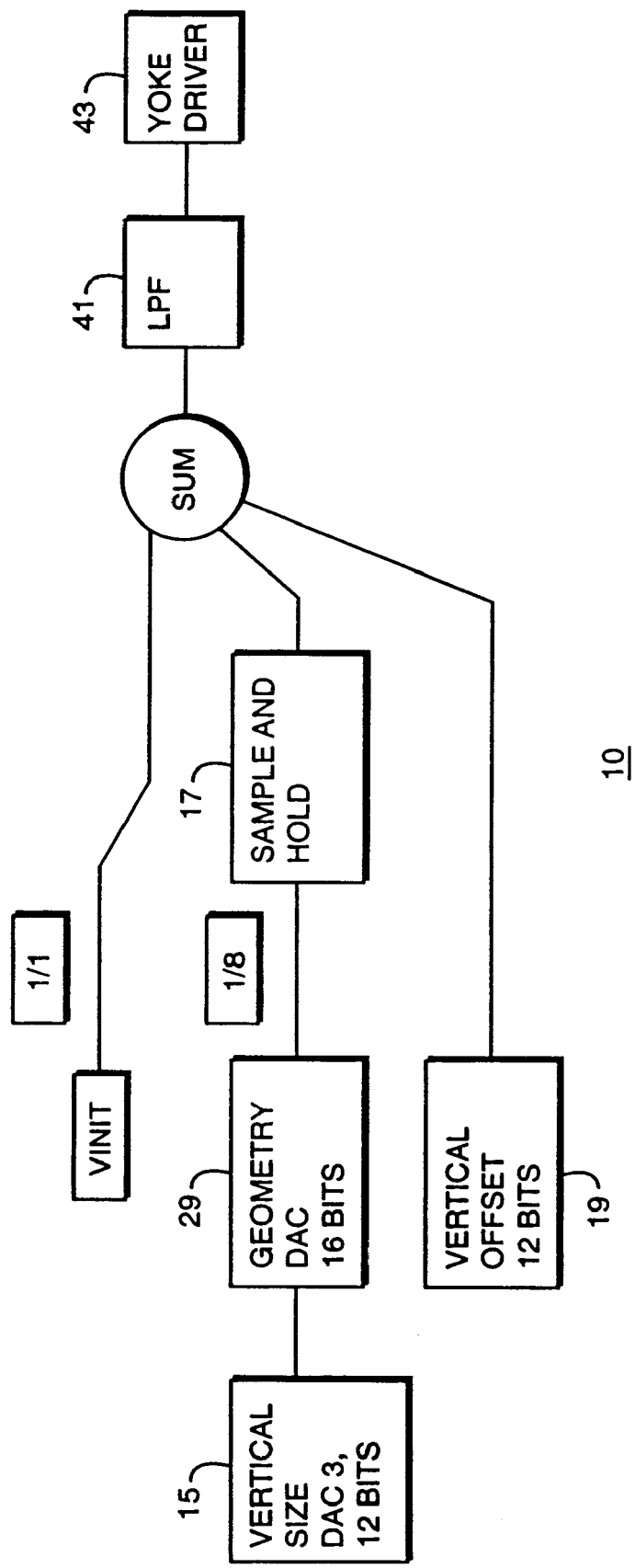

While the resolution of the vertical deflection of the display needs to be greater than 16 bits, the overall accuracy of the deflection system does not need to be as high. It is the line-to-line delta that must be maintained to create a flat field image without perceivable scan lines. There is shown in FIG. 1 a block diagram of a vertical deflection system 10 in accordance with the present invention. Vertical deflection system 10 comprises a coarse DAC 21 for the initial line position that has a voltage range capable of reaching from the top of the vertical deflection area to the bottom. A fine DAC 23 has a range that is 1/16 that of coarse DAC 21. Preferably, fine DAC 23 comprises a 16-bit DAC so as to have a resolution of 20 bits relative to the range of coarse DAC 21.

A delta DAC 25 has a voltage range that is preferably 1/128 that of coarse DAC 21. Preferably, delta DAC comprises a 16-bit DAC so as to have a resolution of 23 bits relative to the range of coarse DAC 21. A reference DAC 27 has a resolution of at least 12 bits, and a range that is equal to or greater than that of coarse DAC 21. A difference amplifier circuit 31 with a gain of about 1000 is used to measure the difference between an output sum 33 from the combined outputs of coarse DAC 21, fine DAC 23, and delta DAC 25, and an output 35 from reference DAC 27.

Output 37 of difference amplifier circuit 31 is provided to a 12-bit analog-to-digital (A/D) converter 41 via a low-pass filter (LPF) 49 and a gain block 51 to give an effective gain of about 200. An input range of 5 volts to A/D converter 41 will give a measurement resolution of less than 7 microvolts relative to the range of coarse DAC 21. Assuming a deflection range of 16 volts, this gives a measurement resolution better than 1 part in 2 million, or greater than 21 bits relative to the deflection range. The actual measurement capability is limited by noise in the signals presented to difference amplifier circuit 31. Preferably, this capability allows measurement that is repeatable to at least 18 bits. As is understood by one skilled in the relevant art, the smaller the spot size on the CRT used, the greater the resolution that is required.

Coarse DAC 21 and fine DAC 23 are used to set the initial value of a scan line. Delta DAC 25 provides a value for the distance to the next scan line. Reference DAC 27 is set to the value of output sum 33 with sufficient precision such that output 37 of difference amplifier 31 is not forced to the ground or Vcc supply rail. A/D converter 41 measures the difference with the delta value to the next scan line present. Delta DAC 25 is then zeroed, and coarse DAC 21 and fine DAC 23 are adjusted until the difference between the output of reference DAC 27 and the sum of the outputs of coarse DAC 21 and fine DAC 23 from is equal to the value of prior output sum 33. In this way, the value of the combined outputs of coarse DAC 21 and fine DAC 23 is set to the value necessary to begin the next scan line.

Greater detail of vertical deflection system 10 is provided in the schematic sheets of Appendix I.

Calibration Sequence

1. Set coarse DAC 21 and fine DAC 23 to the 20-bit value of the initial scan line. Save these values in memory as coarse and fine DAC values, necessary for the first scan line.

2. Calculate the line-to-line interval as required. Set delta DAC 25 to the interval value necessary for the beginning of the next scan line.

3. Set reference DAC 27 such that the output of reference DAC 27 precisely matches the combined outputs of coarse DAC 21, fine DAC 23, and delta DAC 25 (i.e., output sum 33) such that output 37 of difference amplifier 31 is not railed.

4. Measure the output of difference amplifier 31 with A/D converter 41 and save the value in memory.

5. Zero delta DAC 25, and adjust the combination of coarse DAC 21 and fine DAC 23 until the value measured by A/D converter 41 matches the saved value to the resolution needed ($\geq 19$ bits) in step 4. Save the values of coarse DAC 21 and fine DAC 23 in memory for the "next" line.

6. Repeat steps 2 to 5 for every scan line in the image, saving the coarse and fine values in memory. The saved coarse and fine values from this calibration procedure will be used to set coarse DAC 21 and fine DAC 23 prior to each scan line as the image is printed. If there are 6372 scan lines in a given image, there will be 6372 pairs of coarse and fine values created by the calibration procedure and stored in memory.

Vertical deflection system 10 further corrects for CRT pincushion distortion in the vertical dimension by predistorting the vertical position waveform so as to offset the pincushion. Thus, the vertical deflection value will change as the beam is scanned horizontally. This also points to a need for very high resolution in the vertical deflection.

To correct for pincushion, a geometry DAC 29 is used. Coarse DAC 21 and fine DAC 23 are preferably bandwidth-limited so as to reduce the noise measured by A/D converter 41 during calibration. The input values of geometry DAC 29 will continuously change as the CRT beam scans horizontally. The range of geometry DAC 29 is ⅛ the range of coarse DAC 21. Thus a relatively high speed 16-bit DAC is needed for geometry DAC 29. In most applications, a ⅛th range is large enough to correct for the worst-case tilt of the CRT yoke, and worst-case pincushion. With the disclosed combination of DACs, a 19-bit resolution can be achieved. For applications in which a relatively shallow CRT is used, the ⅛th range can be increased to a ¹⁄₁₆th range to achieve a 20-bit resolution. The output of geometry DAC 29 is added to the outputs of coarse DAC 21 and fine DAC 23 for setting the vertical position of the CRT beam as the line is scanned.

In a film recorder a color image is created by printing three planes of image data—one for red, one for green, and one for blue. Since the vertical resolution and vertical area of each printed image plane will be the same, the values of coarse DAC 21 and fine DAC 23 used at the beginning of each scan line will also be the same for all three image planes. Thus the calibration of the necessary values of coarse DAC 21 and fine DAC 23 can be calibrated and stored prior to the printing of the image. Note here that the combination of coarse DAC 21 and fine DAC 23 will have a resolution of 19 to 20 bits, while the overall accuracy of the combination of coarse DAC 21 and fine DAC 23 may be no more than 12 bits. That is to say that, in an image comprising over 6372 scan lines, the sum of the errors in the line-to-line positioning can add up to absolute errors in output voltage of the combination of coarse DAC 21 and fine DAC 23 that are on the order of 12 bits. For example, if there is a continuous line-to-line error of one LSB at 19 bits, the absolute positioning error could be one LSB at 12 bits over only 128 scan lines. This is adequate with the disclosed system as a slowly-changing line-to-line error will not be perceived as a scan line. Thus, the vertical deflection area need be accurate to only 11 or 12 bits.

Additionally a gain error may be present between coarse DAC 21 and the geometry DAC 29. In other words, the gain ratio between coarse DAC 21 and geometry DAC 29 will most likely not be exactly ⅛ because of tolerances in resistor values and in DAC gain values. For a set of symmetric DAC values with a perfect gain ratio, the expected image would be symmetric (assuming a perfectly symmetric CRT and deflection yoke). The gain error between coarse DAC 21 and geometry DAC 29 would cause the image to appear asymmetric.

The geometry calibration system used by the factory to measure beam position will correct for these gain errors as it is part of a feedback loop. For example, if the lower right hand corner of the image is imaging too low, the geometry calibration system will adjust the deflection values until the lower right hand corner of the image is in the right place. All that is required of the deflection system is that it be repeatable for the feedback to work properly. The geometry calibration system will create an image size and position that is accurate to about 9 to 10 bits.

Noise considerations in the hardware:

For vertical deflection system 10 to operate optimally, the A/D measurements must be repeatable to an equivalent resolution of 18 to 19 bits. Thus the components used must be low-noise components, and the bandwidth of the measured signal must be restricted as much as possible without increasing the calibration time too much. Additionally, multiple A/D measurements can be made, and the results averaged, which is done with vertical deflection system 10. The noise performance can be empirically determined by sampling a DC output of difference amplifier 31. If the noise is too high, the bandwidth of the amplifiers into and out from difference amplifier 31 can be restricted. The component values provided in the Appendix have been shown empirically to have a resolution of 19 or more bits when the results are averaged with 20 samples per average.

Circuit board considerations

Preferably, well-known methods for low-noise analog design are used in the layout of the circuit board used in fabrication of vertical deflection system 10. Such methods include: using ground planes, separating ground return paths, and using capacitive shielding for sensitive signals. These methods provide for an acceptable noise performance of the design. The grounding scheme of the ground returns to the supply must also be carefully chosen to eliminate ground loops and cross-coupling of ground currents between different circuits. Preferably, multiple regulators and voltages are used to reduce the possibility of power supply noise, and to minimize cross coupling from the video circuit, which might influence the signals that drive the beam position.

Thermal factors:

The circuit design should be stable over a temperature range such that the temperature variations under worst-case circumstances result in errors which vary smoothly with the calibration. As stated earlier, absolute accuracy is not essential in the disclosed system, but positional errors must occur in a smooth fashion such that the final image does not exhibit any noticeable discontinuities. Thus, the specified components are preferably those that exhibit temperature stability. By way of an example, 10 ppm/deg 0.1% resistors are used in the calibration circuitry. The circuit board further comprises a temperature measuring circuit, which can be used to initiate a recalibration of the vertical deflection.

It can be appreciated by one skilled in the relevant art that vertical deflection system 10 is not limited to comprising components having the particular resolution parameters disclosed in the preferred embodiment but may alternatively comprise DACs of other resolutions. There are many possible variations of number of bits for coarse DAC 21, fine DAC 23, delta DAC 25, and reference DAC 27 that will work in accordance with the above disclosure. For example, in the above embodiment, delta DAC 25 comprises a 16-bit DAC. In an alternative embodiment, vertical deflection system 10 can comprise a 12-bit DAC for delta DAC 25, with the resistance values of scaling resistors (i.e., R162 and R163 in sheet 6 of Appendix I) increased by a factor of sixteen (e.g., the resistance of R162 increased by a factor of eight and the resistance of R163 increased by a factor of two). In yet another alternative embodiment, coarse DAC 21 can comprise a 10-bit DAC or a 16-bit DAC.

It should also be noted that the input digital data to vertical deflection comprises a resolution of 20 bits in the present invention. By using coarse DAC 21 and fine DAC 23 with geometry DAC 25, this allows the data sent to the deflection circuitry to all fit within a 16-bit space, allowing the data outputs to be accomplished with 16-bit-wide hardware.

While there have been described herein preferred embodiments of the present invention, it will be readily apparent to those skilled in the relevant art that various changes and modifications may be made therein without departing from the scope of the invention, and it is intended in the wording of the appended claims to include such changes and modifications as would be encompassed by the true spirit and teachings of the invention. As will be appreciated by those skilled in the relevant art, the embodiments described are not meant to be interpreted in a limiting sense.

APPENDIX I

Analog Board Schematics

Description of Analog Board Schematic

Sheet 1 of 6

Sheet 1 shows the back end of horizontal and vertical deflection circuitry comprising a preferred embodiment of a scanning system in accordance with the present invention. U63 and associated components comprise a low pass filter for the vertical deflection system block diagram of FIG. 1. U50 is a yoke driver amplifier as is U26 [pins 1,2,5]—these parts are alternates. The yoke driver amplifier and associated components comprise yoke driver 47, as shown in the block diagram of FIG. 1.

Sheet 2 of 6

Sheet 2 shows digital circuitry to interface to the digital information used to create the analog signals, the circuitry comprising a preferred embodiment of a scanning system in accordance with the present invention. U14 and U15 comprise circuitry to convert a stream of 16-bit parallel deflection data to serial data to drive the horizontal DAC and the geometry DAC. U14 and U15 also send digital data to the video circuit. U13 multiplexes the DSP serial bus to the coarse DAC, fine DAC, delta DAC, and reference DAC as well as the vertical size DAC1, vertical size DAC 2, vertical size DAC3 and vertical offset DAC. U48 and U49 comprise a 16-bit bus that sends various control signals to U14, U15 and U13 to control parallel-to-serial conversion and serial bus demultiplexing. U48 and U49 also demultiplex the MUX input to the A./D converter.

U46 comprises a voltage reference for the video circuit. U28 comprises a 12-volt regulator to condition the +15 voltage. U32 comprises a −12-volt regulator to condition the −15 voltage. U54 comprises a 5-volt regulator used to power the serial input DACs including: coarse DAC 21, fme DAC 23, delta DAC 25, reference DAC 27, vertical size DAC1 11, vertical size DAC2 13, vertical size DAC3 15, geometry DAC 29, and vertical offset DAC 19. U45 comprises a voltage reference used for the horizontal deflection. U38 comprises an 8-MHz clock used for the horizontal and geometry DACs. U29 comprises the heater voltage for the CRT.

Sheet 3 of 6

Sheet 3 shows an 8-DAC trim DAC for video, horizontal, and autoluma trimming as well as grid 1 control for the CRT, comprising a preferred embodiment of a scanning system in accordance with the present invention. Also shown are power-up and power-down protection circuitry for the CRT and grid 1 control amplifier.

Sheet 4 of 6

Sheet 6 shows U39 comprising vertical size DAC1 11 and vertical size DAC2 13 of a preferred embodiment of a scanning system in accordance with the present invention. Coarse DAC 21 comprises U20 and associated components. Fine DAC 23 comprises U66 with associated components. Delta DAC 25 comprises U67 with associated components. Reference DAC 27 comprises U21 with associated components. Difference amplifier 31 comprises U52 with associated components.

Preferably, quad op amp ICs U18 and U19 comprise LT1125 devices from Linear Technology—very low noise op amps. In a preferred embodiment: i) difference amplifier 31 comprises a Burr Brown INA118U, ii) DACs comprise Linear Technology DACs, iii) AD713 amplifiers comprise Analog Device components, and iv) the 0.1% resistors all have a temperature coefficient of 10 ppm/deg C.

Sheet 5 of 6

Sheet 5 shows the horizontal DAC and associated circuitry comprising an embodiment of a preferred embodiment of a scanning system in accordance with the present invention. The components U37 and U11 pins 1,2, and 3, comprise a voltage reference for vertical size DAC1 11, vertical size DAC2 13, vertical size DAC3 15, and vertical offset DAC 19. Preferably, this voltage reference comprises a Maxim 6350 device—a very low-noise, very stable reference. Vertical size DAC3 15 comprises U22 and associated circuitry. Geometry DAC 29 comprises U30 and associated circuitry. Low pass filter 43 comprises a first op-amp (i.e., at U11 pins 10, 11, and 12) and 1/4.92 gain block 45 comprises a second op-amp (i.e., at U11 pins 5, 6, and 7). 1/4.92 gain block 45 serves to place the signal within the input range of A/D converter 41. The DACs shown comprise Linear Technology devices.

Sample and hold 17, shown in the block diagram of FIG. 1, is here shown as implemented internally as part of the output circuitry of U30.

Sheet 6 of 6

Sheet 6 shows a temperature measuring circuit comprising a preferred embodiment of a scanning system in accordance with the present invention. The measuring circuit comprises U36 (preferably Analog Devices AD592) and associated circuitry, the CRT light measuring circuit (comprising multiplier U44 and an input to U17), A/D multiplexer U58, and A/D converter 41 (comprising U17). The temperature may be used to decide when to recalibrate the vertical deflection.

What is claimed is:

1. A scanning system for providing a linear output to a deflection circuit comprising:
    a coarse digital-to-analog converter having a digital input and an analog output;
    a fine digital-to-analog converter having a digital input and an analog output;
    a delta digital-to-analog converter having a digital input and an analog output;
    a first summing circuit having a first input connected to the analog output from the coarse digital-to-analog converter, having a second input connected to the analog output from the fine digital-to-analog converter, and having a third input connected to the analog output from the delta digital-to-analog converter;
    a reference digital-to-analog converter having a digital input and an analog output;
    a difference amplifier having a first and second input and an analog output, wherein the reference digital-to-analog converter analog output is connected to the first input, and the output from the first summing circuit is connected to the second input;
    an analog-to-digital converter having an analog input and a digital output, said analog-to-digital converter analog input is connected to the output of the difference amplifier;
    a memory; and
    a processor and a digital bus connected to said memory, to the digital output of the analog-to-digital converter, and to the digital inputs of the coarse, fine, delta, and the reference digital-to-analog converters.

2. The scanning system of claim 1 further comprising:
    a geometry digital-to-analog converter having a digital input and an analog output;
    a sample and hold circuit having an analog input and an analog output, said analog input connected to the output of the geometry digital-to-analog converter;
    a second summing circuit having a first input connected to the analog output of the sample and hold circuit, having a second input connected to the analog output from the first summing circuit, and having an analog output;
    a yoke driver having an analog input connected to the output of the second summing circuit and having a output connected to the yoke on a cathode ray tube.

3. The scanning system of claim 2 further comprising:
    a vertical offset digital-to-analog converter having a digital input and an analog output;
    the second summing circuit further comprising a third input connected to the analog output of the vertical offset digital-to-analog converter.

4. The scanning system of claim 3 further comprising:
    a low pass filter having an analog input and an analog output, said analog input connected to the output of the difference amplifier and the output connected to the input of the analog-to-digital converter.

5. The scanning system of claim 2 further comprising;
    a low pass filter having an analog input and an analog output, said analog input connected to the output of the second summing circuit and the output connected to the input of the yoke driver.

6. The scanning system of claim 1 further comprising;
    a low pass filter having an analog input and an analog output, said analog input connected to the output of the difference amplifier and the output connected to the input of the analog-to-digital converter.

7. A method for providing a linear output to a deflection circuit of a scanning system comprising the steps of:
    (a) calculating the number of vertical lines for a selected resolution;
    (b) calibrating the scanning system;
    (c) setting an initial deflection output corresponding to the initial line;
    (d) incrementing the line number by looking up a table value and supplying a digital input to both the coarse digital-to-analog converter and fine digital-to-analog converter;
    (e) summing the coarse output and the fine output to produce the output to the yoke deflection circuit; and
    (f) repeating step (d) to (e) until all the lines have been scanned.

8. A method of calibrating a film recorder scanning system comprising the steps of:
    (a) setting a coarse digital-to-analog converter and a fine digital-to-analog converter to a value of the initial scan line and saving these values in a memory as coarse and fine digital-to-analog converter values for a first scan line;
    (b) calculating the line-to-line interval and setting a delta digital-to-analog converter to the interval value necessary for the beginning of the next scan line;
    (c) setting a reference digital-to-analog converter such that the output of reference digital-to-analog converter precisely matches the combined outputs of coarse digital-to-analog converter, fine digital-to-analog converter and delta digital-to-analog converter such that output of difference amplifier is not railed;
    (d) measuring the output of difference amplifier with A/D converter and saving the value in memory;
    (e) zeroing the delta digital-to-analog converter, and adjusting the combination of coarse digital-to-analog converter and fine digital-to-analog converter until the value measured by A/D converter matches the saved value to the resolution in step (d), and saving the values of coarse digital-to-analog converter and fine digital-to-analog converter in memory; and
    (f) repeating steps (b) to (e) for every scan line in the image, saving the coarse and fine values in memory.

* * * * *